United States Patent
Yoshimura et al.

(10) Patent No.: US 10,381,528 B2
(45) Date of Patent: Aug. 13, 2019

(54) IMAGE DISPLAY APPARATUS

(71) Applicants: Sharp Kabushiki Kaisha, Sakai-shi, Osaka (JP); National Institute for Materials Science, Tsukuba-shi, Ibaraki (JP)

(72) Inventors: Kenichi Yoshimura, Sakai (JP); Shigetoshi Ito, Sakai (JP); Makoto Izumi, Sakai (JP); Masamichi Harada, Tsukuba (JP); Hiroshi Fukunaga, Sakai (JP); Naoto Hirosaki, Tsukuba (JP)

(73) Assignees: SHARP KABUSHIKI KAISHA, Sakai (JP); NATIONAL INSTITUTE FOR MATERIALS SCIENCE, Ibaraki (JP)

(*) Notice: Subject to any disclaimer, the term of this patent is extended or adjusted under 35 U.S.C. 154(b) by 232 days.

(21) Appl. No.: 15/236,588

(22) Filed: Aug. 15, 2016

(65) Prior Publication Data
US 2017/0062668 A1 Mar. 2, 2017

(30) Foreign Application Priority Data

Aug. 31, 2015 (JP) ................ 2015-170275
Aug. 31, 2015 (JP) ................ 2015-170276
(Continued)

(51) Int. Cl.
*H01L 33/50* (2010.01)
*C09K 11/00* (2006.01)
(Continued)

(52) U.S. Cl.
CPC ............ *H01L 33/504* (2013.01); *C09K 11/00* (2013.01); *C09K 11/0883* (2013.01);
(Continued)

(58) Field of Classification Search
CPC ... H10L 33/504; C09K 11/0883; C09K 11/57; C09K 11/616; G02F 1/133514; G02F 1/133528
See application file for complete search history.

(56) References Cited

U.S. PATENT DOCUMENTS 8,491,816 B2 * 7/2013 Hong ................... C09K 11/616
252/301.4 H
2006/0169998 A1 * 8/2006 Radkov ................ C09K 11/617
257/98

(Continued)

FOREIGN PATENT DOCUMENTS

JP 2009-96854 * 5/2009
JP 2009-096854 A 5/2009
(Continued)

OTHER PUBLICATIONS

Xie et al, "Crystal structure and photoluminescence of Mn2+-Mg2+ codoped gamma aluminum oxynitride (-AlON): A promising green phoshor for white-light emitting dioes", Applied Physic Letters, 92, May 20, 2008, pp. 201905-1 to 201905-3.*
(Continued)

*Primary Examiner* — C Melissa Koslow
(74) *Attorney, Agent, or Firm* — Keating & Bennett, LLP

(57) ABSTRACT

The present invention provides a light emitting device that makes it possible to provide an image display apparatus having a wide color reproduction range. The light emitting device includes a light emitting element that emits blue light; a $Mn^{2+}$-activated γ-AlON phosphor that is a green phosphor; and a $Mn^{4+}$-activated phosphor that is a red phosphor. The green light emitted by the $Mn^{2+}$-activated γ-AlON phosphor has an emission-spectrum peak wavelength of not less than 518 nm and not more than 528 nm.

8 Claims, 18 Drawing Sheets

| | MIXING RATIO OF RAW MATERIAL POWDERS | | | | | | EMISSION-SPECTRUM HALF WIDTH (nm) | EMISSION-SPECTRUM PEAK WAVELENGTH (nm) | EMISSION-SPECTRUM CHROMATICITY COORDINATES | | HALF WIDTH OF EXCITATION-SPECTRUM PEAK WAVELENGTH AT OR AROUND 445 nm (nm) | Mn CONCENTRATION CONTAINED IN CRYSTALS (wt%) |
|---|---|---|---|---|---|---|---|---|---|---|---|---|
| | AlN | Al₂O₃ | MgO | MnCO₃ | MnO | MnF₂ | | | CIEx | CIEy | | |
| COMPARATIVE PRODUCTION EXAMPLE P0 | 12.66 | 81.78 | 0 | 5.56 | 0 | 0 | 33 | 515 | 0.143 | 0.727 | 22 | 0.45 |
| PRODUCTION EXAMPLE P1 | 13.53 | 78.55 | 5.05 | 2.88 | 0 | 0 | 38 | 518 | 0.187 | 0.721 | 23 | 1.81 |
| PRODUCTION EXAMPLE P2 | 10.91 | 81.41 | 4.77 | 0 | 2.91 | 0 | 41 | 518 | 0.201 | 0.715 | 24.5 | 2.07 |
| PRODUCTION EXAMPLE P3 | 10.7 | 79.86 | 4.68 | 0 | 0 | 4.76 | 38 | 522 | 0.204 | 0.721 | 24 | 2.4 |
| PRODUCTION EXAMPLE P4 | 10.55 | 78.73 | 4.61 | 0 | 0 | 6.1 | 38 | 523 | 0.207 | 0.724 | 25 | 2.44 |
| PRODUCTION EXAMPLE P5 | 10.41 | 77.64 | 4.55 | 0 | 0 | 7.41 | 42 | 524 | 0.223 | 0.716 | 25 | 3.02 |
| COMPARATIVE PRODUCTION EXAMPLE P6 | 10.31 | 76.93 | 4.5 | 0 | 0 | 8.26 | 51 | 529 | 0.262 | 0.690 | 25.5 | 4.56 |
| PRODUCTION EXAMPLE P7 | 10.31 | 76.93 | 4.5 | 0 | 0 | 8.26 | 46 | 528 | 0.242 | 0.703 | 25.5 | 3.45 |

(30) Foreign Application Priority Data

| Aug. 31, 2015 | (JP) | 2015-170277 |
| Apr. 27, 2016 | (JP) | 2016-089385 |
| Apr. 27, 2016 | (JP) | 2016-089386 |
| Apr. 27, 2016 | (JP) | 2016-089387 |

(51) Int. Cl.
    C09K 11/08 (2006.01)
    C09K 11/57 (2006.01)
    C09K 11/61 (2006.01)
    G02F 1/1335 (2006.01)
    G02F 1/1337 (2006.01)

(52) U.S. Cl.
    CPC ............ C09K 11/57 (2013.01); C09K 11/616 (2013.01); *G02F 1/1337* (2013.01); *G02F 1/133514* (2013.01); *G02F 1/133528* (2013.01); *G02F 1/133615* (2013.01); *G02F 2001/133614* (2013.01); *G02F 2001/133624* (2013.01)

(56) References Cited

U.S. PATENT DOCUMENTS

| 2009/0121608 | A1 | 5/2009 | Xie et al. | |
| 2010/0091215 | A1* | 4/2010 | Fukunaga | C09K 11/664 349/61 |
| 2011/0043101 | A1 | 2/2011 | Masuda et al. | |
| 2016/0218251 | A1 | 7/2016 | Tsukatani et al. | |

FOREIGN PATENT DOCUMENTS

| JP | 2009-138070 | A | | 6/2009 |
| JP | 2009-218422 | A | | 9/2009 |
| JP | 2010-093132 | A | | 4/2010 |
| JP | 2015-087527 | | * | 5/2015 |
| JP | 2015-087527 | A | | 5/2015 |
| JP | 2015-156456 | A | | 8/2015 |
| WO | 2007/099862 | A1 | | 9/2007 |
| WO | 2009/110285 | A1 | | 9/2009 |
| WO | 2014/104079 | A1 | | 7/2014 |

OTHER PUBLICATIONS

Yoshimura et al, "The white LED with gamma-AlON:Mn2+,Mg2+ phoshor for wide-color gamut display", the 363th Phosphor Reasearch Society Meeting Technical Digest. Jun. 3, 2016.*
Translation of JP 2009-96854, May 7, 2009.*
Xie et al., "Gamma-AlON:Mn2+: An interesting narrow band green phosphor for white LED backlights", National Institute for Material Science, I-29, Jul. 26-30, 2015, 1 page.
Xie et al., "Crystal structure and photoluminescence of Mn 2 +-Mg 2 + codoped gamma aluminum oxynitride (-Al O N) : A promising green phosphor for white light-emitting diodes", Applied Physics Letters 92, 2008, 4 pages.
Yoshimura et al., "The white LED with γ-AlON:Mn, Mg for wide-color gamut display", The 363th Phosphor Research Society Meeting Technical Digest, Jun. 3, 2016, 14 pages.
Yoshimura et al., "The white LED with γ-AlON:Mn2+, Mg2+ phosphor and K2SiF6:Mn4+ phosphor for the wide-color gamut display", The 63th Spring Meeting Proceedings, Japan Society of Applied Physics, Mar. 21, 2016, 4 pages.

* cited by examiner

FIG. 4

| | MIXING RATIO OF RAW MATERIAL POWDERS | | | | | | EMISSION-SPECTRUM HALF WIDTH (nm) | EMISSION-SPECTRUM PEAK WAVELENGTH (nm) | EMISSION-SPECTRUM CHROMATICITY COORDINATES | | HALF WIDTH OF EXCITATION-SPECTRUM PEAK WAVELENGTH AT OR AROUND 445 nm (nm) | Mn CONCENTRATION CONTAINED IN CRYSTALS (wt%) |
|---|---|---|---|---|---|---|---|---|---|---|---|---|
| | AlN | Al$_2$O$_3$ | MgO | MnCO$_3$ | MnO | MnF$_2$ | | | CIEx | CIEy | | |
| COMPARATIVE PRODUCTION EXAMPLE P0 | 12.66 | 81.78 | 0 | 5.56 | 0 | 0 | 33 | 515 | 0.143 | 0.727 | 22 | 0.45 |
| PRODUCTION EXAMPLE P1 | 13.53 | 78.55 | 5.05 | 2.88 | 0 | 0 | 38 | 518 | 0.187 | 0.721 | 23 | 1.81 |
| PRODUCTION EXAMPLE P2 | 10.91 | 81.41 | 4.77 | 0 | 2.91 | 0 | 41 | 518 | 0.201 | 0.715 | 24.5 | 2.07 |
| PRODUCTION EXAMPLE P3 | 10.7 | 79.86 | 4.68 | 0 | 0 | 4.76 | 38 | 522 | 0.204 | 0.721 | 24 | 2.4 |
| PRODUCTION EXAMPLE P4 | 10.55 | 78.73 | 4.61 | 0 | 0 | 6.1 | 38 | 523 | 0.207 | 0.724 | 25 | 2.44 |
| PRODUCTION EXAMPLE P5 | 10.41 | 77.64 | 4.55 | 0 | 0 | 7.41 | 42 | 524 | 0.223 | 0.716 | 25 | 3.02 |
| COMPARATIVE PRODUCTION EXAMPLE P6 | 10.31 | 76.93 | 4.5 | 0 | 0 | 8.26 | 51 | 529 | 0.262 | 0.690 | 25.5 | 4.56 |
| PRODUCTION EXAMPLE P7 | 10.31 | 76.93 | 4.5 | 0 | 0 | 8.26 | 46 | 528 | 0.242 | 0.703 | 25.5 | 3.45 |

FIG. 8

| LIGHT EMITTING DEVICE | PRODUCTION EXAMPLE OF GREEN PHOSPHOR | GREEN PHOSPHOR/ RED PHOSPHOR WEIGHT RATIO | SILICONE RESIN/PHOSPHORS WEIGHT RATIO |
|---|---|---|---|
| COMPARATIVE EXAMPLE D0 | COMPARATIVE PRODUCTION EXAMPLE P0 | 38.0 | 0.50 |
| EXAMPLE D1 | PRODUCTION EXAMPLE P1 | 27.8 | 0.54 |
| EXAMPLE D2 | PRODUCTION EXAMPLE P2 | 28.6 | 0.58 |
| EXAMPLE D3 | PRODUCTION EXAMPLE P3 | 22.5 | 0.67 |
| EXAMPLE D4 | PRODUCTION EXAMPLE P4 | 18.8 | 0.65 |
| EXAMPLE D5 | PRODUCTION EXAMPLE P5 | 17.0 | 0.72 |
| COMPARATIVE EXAMPLE D6 | COMPARATIVE PRODUCTION EXAMPLE P6 | 20.5 | 0.80 |
| EXAMPLE D7 | PRODUCTION EXAMPLE P7 | 14.0 | 0.74 |

FIG. 11

| IMAGE DISPLAY APPARATUS | LIGHT EMITTING DEVICE | COLOR REPRODUCTION RANGE | | COLOR REPRODUCTION RANGE | | WHITE POINT | | RED POINT | | GREEN POINT | | BLUE POINT | |
|---|---|---|---|---|---|---|---|---|---|---|---|---|---|
| | | NTSC COVERAGE | NTSC AREA RATIO | Adobe RGB COVERAGE | Adobe RGB AREA RATIO | x | y | x | y | x | y | x | y |
| COMPARATIVE EXAMPLE DIS0 | COMPARATIVE EXAMPLE D0 | 89.3% | 103.3% | 90.7% | 108.1% | 0.281 | 0.288 | 0.682 | 0.297 | 0.153 | 0.710 | 0.145 | 0.098 |
| EXAMPLE DIS1 | EXAMPLE D1 | 93.6% | 102.3% | 96.1% | 107.1% | 0.281 | 0.288 | 0.680 | 0.297 | 0.188 | 0.710 | 0.148 | 0.086 |
| EXAMPLE DIS2 | EXAMPLE D2 | 93.6% | 100.9% | 96.5% | 105.6% | 0.281 | 0.288 | 0.678 | 0.299 | 0.196 | 0.706 | 0.149 | 0.084 |
| EXAMPLE DIS3 | EXAMPLE D3 | 94.5% | 101.9% | 98.0% | 106.6% | 0.280 | 0.288 | 0.678 | 0.298 | 0.199 | 0.712 | 0.150 | 0.081 |
| EXAMPLE DIS4 | EXAMPLE D4 | 94.7% | 101.9% | 98.5% | 106.6% | 0.280 | 0.288 | 0.678 | 0.298 | 0.202 | 0.712 | 0.150 | 0.080 |
| EXAMPLE DIS5 | EXAMPLE D5 | 93.5% | 100.3% | 98.6% | 105.0% | 0.281 | 0.288 | 0.677 | 0.299 | 0.214 | 0.707 | 0.151 | 0.077 |
| COMPARATIVE EXAMPLE DIS6 | COMPARATIVE EXAMPLE D6 | 88.0% | 95.3% | 92.4% | 99.8% | 0.281 | 0.288 | 0.672 | 0.302 | 0.242 | 0.691 | 0.152 | 0.070 |
| EXAMPLE DIS7 | EXAMPLE D7 | 90.9% | 98.1% | 95.5% | 102.7% | 0.280 | 0.288 | 0.675 | 0.300 | 0.228 | 0.700 | 0.152 | 0.073 |

FIG. 14

| LIGHT EMITTING DEVICE | PRODUCTION EXAMPLE OF GREEN PHOSPHOR | PEAK WAVELENGTH OF LIGHT EMITTING ELEMENT (nm) | GREEN PHOSPHOR/ RED PHOSPHOR WEIGHT RATIO | SILICONE RESIN/PHOSPHORS WEIGHT RATIO | LUMINOUS EFFICIENCY OF LIGHT EMITTING DEVICE (RELATIVE VALUE) |
|---|---|---|---|---|---|
| EXAMPLE D5 | PRODUCTION EXAMPLE P5 | 445 | 17.0 | 0.72 | 100 |
| EXAMPLE D8 | PRODUCTION EXAMPLE P5 | 430 | 20.7 | 0.77 | 81 |
| EXAMPLE D9 | PRODUCTION EXAMPLE P5 | 440 | 18.9 | 0.72 | 96 |
| EXAMPLE D11 | PRODUCTION EXAMPLE P5 | 460 | 15.2 | 0.62 | 88 |

FIG. 17

| LIGHT EMITTING DEVICE | PRODUCTION EXAMPLE OF GREEN PHOSPHOR | GREEN PHOSPHOR/ RED PHOSPHOR WEIGHT RATIO | SILICONE RESIN/PHOSPHORS WEIGHT RATIO |
|---|---|---|---|
| EXAMPLE D10 | PRODUCTION EXAMPLE P4 | 15.6 | 0.66 |

FIG. 18

| IMAGE DISPLAY APPARATUS | LIGHT EMITTING DEVICE | COLOR REPRODUCTION RANGE | | COLOR REPRODUCTION RANGE | | WHITE POINT | | RED POINT | | GREEN POINT | | BLUE POINT | |
|---|---|---|---|---|---|---|---|---|---|---|---|---|---|
| | | NTSC COVERAGE | NTSC AREA RATIO | Adobe RGB COVERAGE | Adobe RGB AREA RATIO | x | y | x | y | x | y | x | y |
| EXAMPLE DIS5 | EXAMPLE D5 | 93.5% | 100.3% | 98.6% | 105.0% | 0.281 | 0.288 | 0.677 | 0.299 | 0.214 | 0.707 | 0.151 | 0.077 |
| EXAMPLE DIS10 | EXAMPLE D10 | 93.7% | 113.2% | 98.2% | 118.5% | 0.281 | 0.288 | 0.675 | 0.298 | 0.176 | 0.730 | 0.155 | 0.030 |

IMAGE DISPLAY APPARATUS

TECHNICAL FIELD

The present invention relates to a light emitting device including a light emitting element and a wavelength conversion member, and an image display apparatus including the light emitting device.

BACKGROUND ART

Recent years have seen development of a light emitting device obtained by combining (i) a light emitting element such as a light emitting diode (LED) with (ii) a wavelength conversion member that converts excitation light from the light emitting element into fluorescence (for example, a member containing phosphor particles dispersed in resin). The above light emitting device advantageously has a compact size and consumes less power than an incandescent lamp, and accordingly has been put into practical use as a light source for any of various image display apparatuses and illumination apparatuses.

Typically used one of such light emitting devices combines a blue LED and a yellow phosphor. As the yellow phosphor, Ce-activated yttrium-aluminum-garnet (YAG) phosphors have been widely used because of their high luminous efficiency.

In a case where a light emitting device is used in an image display apparatus, the image display apparatus has a wider color reproduction range at a smaller emission-spectrum half width of a phosphor. However, the Ce-activated YAG phosphor has a relatively-large emission-spectrum half width of approximately 100 nm. It follows that, in a case where the Ce-activated YAG phosphor is used as a yellow phosphor in a light emitting device and this light emitting device is used as a backlight device for liquid crystals of an image display apparatus, the image display apparatus will have a color reproduction range that is not sufficiently wide.

Specifically, the above image display apparatus can have a color gamut that covers substantially all the sRGB color gamut, which is used for cathode-ray tubes (CRTs). However, the image display apparatus has a considerably low coverage of the NTSC color gamut defined by the National Television System Committee (NTSC) or the Adobe RGB color gamut, each of which is wider than the sRGB color gamut and is used for wide-color gamut liquid crystal displays.

More specifically, in an image display apparatus which uses, as a backlight device for liquid crystals, a light emitting device including the Ce-activated YAG yellow phosphor, an NTSC color gamut coverage and an Adobe RGB color gamut coverage of a color gamut of the image display apparatus remain approximately 70% each. The above light emitting device is thus not suitable for use in wide-color gamut liquid crystal displays.

The "sRGB color gamut" as used herein means a color gamut represented by a triangle defined by three chromaticity points at (CIEx, CIEy)=(0.640, 0.330), (0.300, 0.600), and (0.150, 0.060) on the Commission Internationale de l'Eclairage (CIE) 1931 chromaticity coordinates.

Meanwhile, the "NTSC color gamut" as used herein means a color gamut represented by a triangle defined by three chromaticity points at (CIEx, CIEy)=(0.670, 0.330), (0.210, 0.710), and (0.140, 0.080) on the CIE 1931 chromaticity coordinates. Further, the "Adobe RGB color gamut" as used herein means a color gamut represented by a triangle defined by three chromaticity points at (CIEx, CIEy)=(0.640, 0.330), (0.210, 0.710), and (0.150, 0.060) on the CIE 1931 chromaticity coordinates. A comparison between the sRGB color gamut and each of the NTSC color gamut and the Adobe RGB color gamut shows that the NTSC color gamut and the Adobe RGB color gamut each have a green color reproduction range wider than that of the sRGB color gamut.

A light emitting device in which two phosphors, i.e., a green phosphor and a red phosphor, are used in combination is suitable for use as a backlight device in wide-color gamut liquid crystal displays whose color gamut corresponds to the NTSC color gamut or the Adobe RGB color gamut. Further, the above two phosphors each preferably have a small emission-spectrum half width.

For example, Patent Literature 1 discloses a light emitting device in which a Eu-activated β-SiAlON phosphor (green phosphor) and a $Mn^{4+}$-activated fluoride complex (red phosphor) are used as phosphors in combination. When this combination is used to configure an image display apparatus, the image display apparatus can have a color reproduction range wider than that of a conventionally typical image display apparatus in which a yellow phosphor is used as a phosphor. This is because the Eu-activated β-SiAlON phosphor and a $Mn^{4+}$-activated fluoride complex phosphor each have an emission-spectrum half width smaller than that of the Ce-activated YAG phosphor. Specifically, the Eu-activated β-SiAlON phosphor has an emission-spectrum half width of not more than 55 nm, and the $Mn^{4+}$-activated fluoride complex phosphor has an emission-spectrum half width of not more than 10 nm.

Patent Literature 2 discloses an example of a light emitting device that can achieve a color reproduction range wider than that of the light emitting device disclosed in Patent Literature 1. This light emitting device makes use of a combination of a Mn-activated γ-AlON phosphor (green phosphor) and a $Mn^{4+}$-activated fluoride complex (red phosphor) as phosphors. Patent Literature 2 also discloses that the green phosphor has an emission-spectrum peak wavelength of 510 nm to 550 nm and an emission-spectrum half width of not more than 55 nm (preferably not more than 45 nm). In addition, Patent Literature 2 discloses, as a production example of the green phosphor, a Mn-activated γ-AlON phosphor having an emission-spectrum peak wavelength of 515 nm and an emission-spectrum half width of 33 nm.

Patent Literature 3 discloses a light emitting device in which a Mn-activated oxide phosphor or a Mn-activated oxynitride phosphor is used as a green phosphor. Specifically, in the light emitting device disclosed in Patent Literature 3, the above green phosphor and a Eu-activated phosphor (red phosphor) are used in combination as phosphors. Further, Patent Literature 3 also discloses that the above green phosphor has an emission-spectrum half width of not more than 40 nm. As with Patent Literature 2, Patent Literature 3 discloses, as a production example of the green phosphor, a Mn-activated γ-AlON phosphor having an emission-spectrum peak wavelength of 515 nm and an emission-spectrum half width of 33 nm.

Patent Literature 4 discloses a production example of a color filter for use in image display apparatuses.

Patent Literatures 5 and 6 also disclose Mn-activated γ-AlON phosphors.

CITATION LIST

Patent Literature

Patent Literature 1
International Publication No. WO 2009/110285 (Publication date: Sep. 11, 2009)
[Patent Literature 2]
Japanese Patent Application Publication Tokukai No. 2010-93132 (Publication date: Apr. 22, 2010)

[Patent Literature 3]
Japanese Patent Application Publication Tokukai No. 2009-218422 (Publication date: Sep. 24, 2009)
[Patent Literature 4]
Japanese Patent Application Publication Tokukai No. 2015-87527 (Publication date: May 7, 2015)
[Patent Literature 5]
International Publication No. WO 2007/099862 (Publication date: Sep. 7, 2007)
[Patent Literature 6]
Japanese Patent Application Publication Tokukai No. 2009-96854 (Publication date: May 7, 2009)

SUMMARY OF INVENTION

Technical Problem

Patent Literature 1 is configured to use a Eu-activated β-SiAlON phosphor as a green phosphor, and Patent Literature 3 is configured to use a Eu-activated phosphor as a red phosphor. This may consequently cause a color reproduction range that can be achieved by each of the above configurations to be narrower than that which can be achieved by a light emitting device in which a Mn-activated γ-AlON phosphor (green phosphor) and a $Mn^{4+}$-activated fluoride complex (red phosphor) are used as phosphors in combination.

Further, with a configuration disclosed in Patent Literature 2, it may not possible to provide an image display apparatus that has a color gamut required for use in wide-color gamut liquid crystal displays. More specifically, an image display apparatus disclosed in Patent Literature 2 has a large NTSC color gamut area ratio, which is a ratio of an area of a color gamut of the above image display apparatus with respect to an entire area of the NTSC color gamut. In contrast, the image display apparatus disclosed in Patent Literature 2 has at least a low NTSC color gamut coverage, which is a ratio of an area covered in an area of the NTSC color gamut by the color gamut of the above image display apparatus, with respect to the entire area of the NTSC color gamut. It follows that in a case where the image display apparatus disclosed in Patent Literature 2 is used as an image display apparatus in conformity with a wide-color gamut standard such as the NTSC color gamut or the Adobe RGB color gamut, a color gamut that the image display apparatus can practically use for display may be smaller. That is, with the configuration disclosed in Patent Literature 2, it is difficult to provide an image display apparatus that has higher color reproducibility for a wide color gamut such as the NTSC color gamut and the Adobe RGB color gamut.

Patent Literatures 5 and 6 each disclose a Mn-activated γ-AlON phosphor (green phosphor), but not a light emitting device that combines the above green phosphor and a $Mn^{4+}$-activated fluoride complex (red phosphor). Further, neither of Patent Literatures 5 and 6 does not disclose any technical idea to provide an image display apparatus having a wide color reproduction range.

An object of the present invention is to provide (a) a light emitting device that makes it possible to provide an image display apparatus having a wide color reproduction range and (b) an image display apparatus including the light emitting device.

Solution to Problem

In order to solve the above problem, a light emitting device in accordance with one aspect of the present invention includes: a light emitting element that emits blue light; a $Mn^{2+}$-activated γ-AlON phosphor that emits green light in response to excitation by the blue light; and a $Mn^{4+}$-activated phosphor that emits red light in response to excitation by the blue light, the green light emitted by the $Mn^{2+}$-activated γ-AlON phosphor having an emission-spectrum peak wavelength of not less than 518 nm and not more than 528 nm.

Further, in order to solve the above problem, a light emitting device in accordance with one aspect of the present invention includes: a light emitting element that emits blue light; a $Mn^{2+}$-activated γ-AlON phosphor that emits green light in response to excitation by the blue light; and a $Mn^{4+}$-activated phosphor that emits red light in response to excitation by the blue light, the $Mn^{2+}$-activated γ-AlON phosphor having a Mn concentration of not less than 1.5 wt % and not more than 4.5 wt %.

Furthermore, in order to solve the above problem, a light emitting device in accordance with one aspect of the present invention includes: a light emitting element that emits blue light; a $Mn^{2+}$-activated γ-AlON phosphor that emits green light in response to excitation by the blue light; and a $Mn^{4+}$-activated phosphor that emits red light in response to excitation by the blue light, the green light emitted by the $Mn^{2+}$-activated γ-AlON phosphor having an emission-spectrum half width of not less than 35 nm and not more than 50 nm.

Advantageous Effects of Invention

One aspect of present invention can advantageously provide a light emitting device that makes it possible to provide an image display apparatus having a wide color reproduction range.

BRIEF DESCRIPTION OF DRAWINGS

FIG. 4 is a table that shows a mixing ratio of raw material powders and measurement results for each of the respective green phosphors in accordance with the Comparative Production Examples and the Production Examples.

Figure 6:
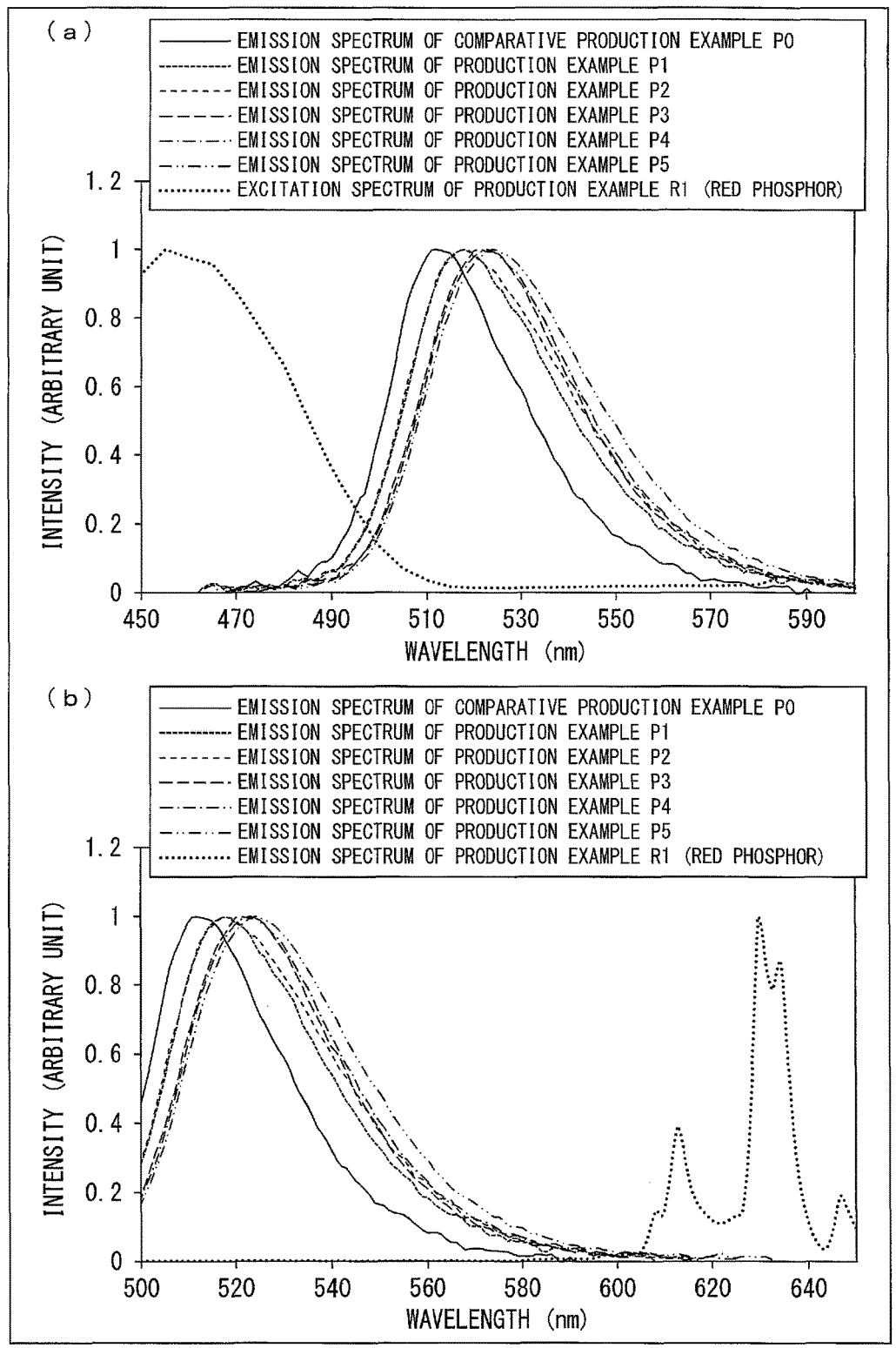

(a) of FIG. 6 is a graph that shows emission spectra of green phosphors in accordance with one of the Comparative Production Examples and some of the Production Examples and the excitation spectrum of the red phosphor, and (b) of FIG. 6 is a graph that shows the emission spectra of the green phosphors and the emission spectrum of the red phosphor.

Figure 7:
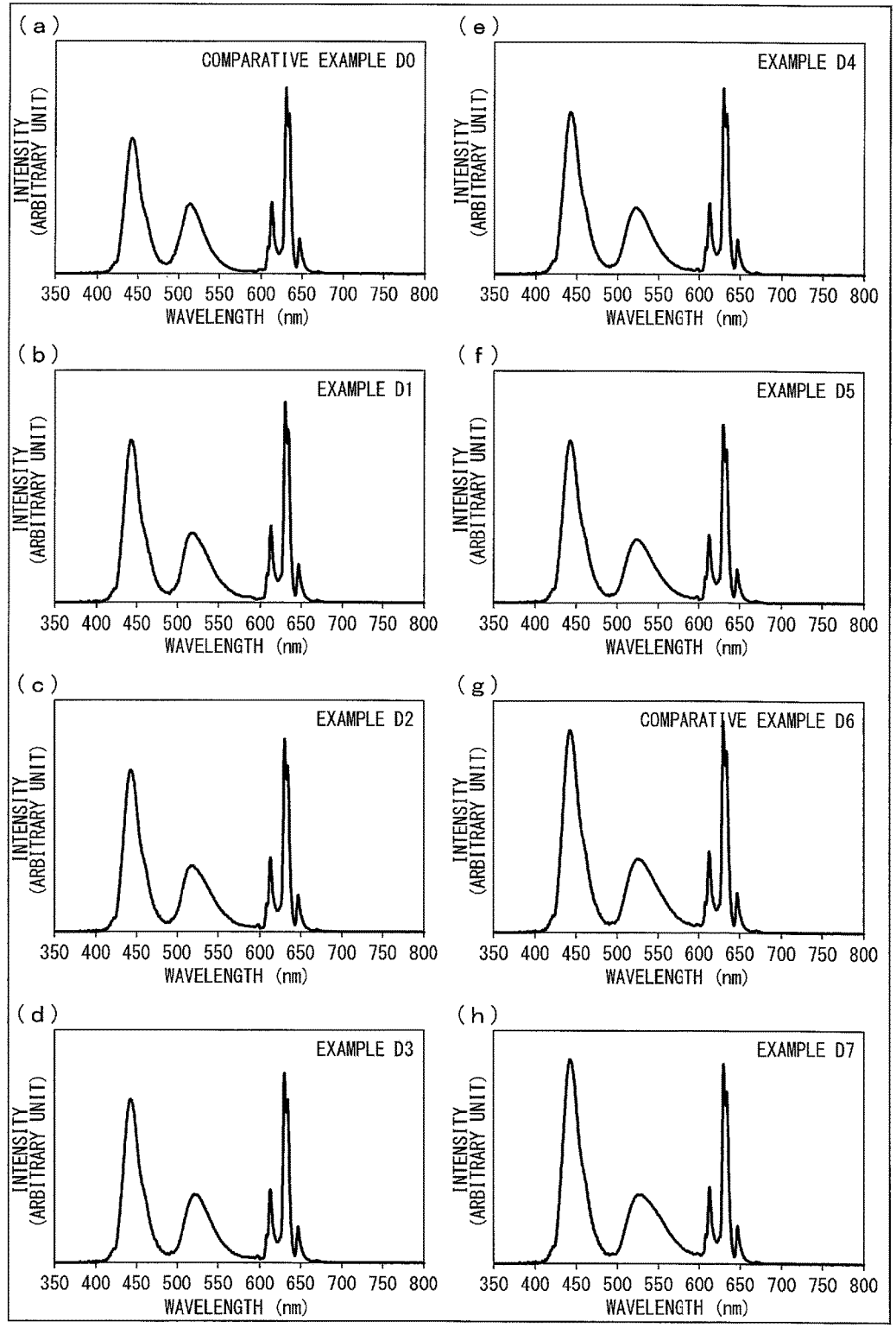

(a) and (g) of FIG. 7 are each a graph that shows an emission spectrum of a light emitting device in accordance with a Comparative Example, and (b) through (f) and (h) of FIG. 7 are each a graph that shows an emission spectrum of a light emitting device in accordance with an Example.

FIG. 8 is a table that shows, for each of the light emitting devices of the Examples and the Comparative Examples, (i) a mixing ratio of a green phosphor to a red phosphor both dispersed in a dispersion medium (resin) and (ii) a mixing ratio of the dispersion medium to the combination of the green phosphor and the red phosphor.

Figure 9:
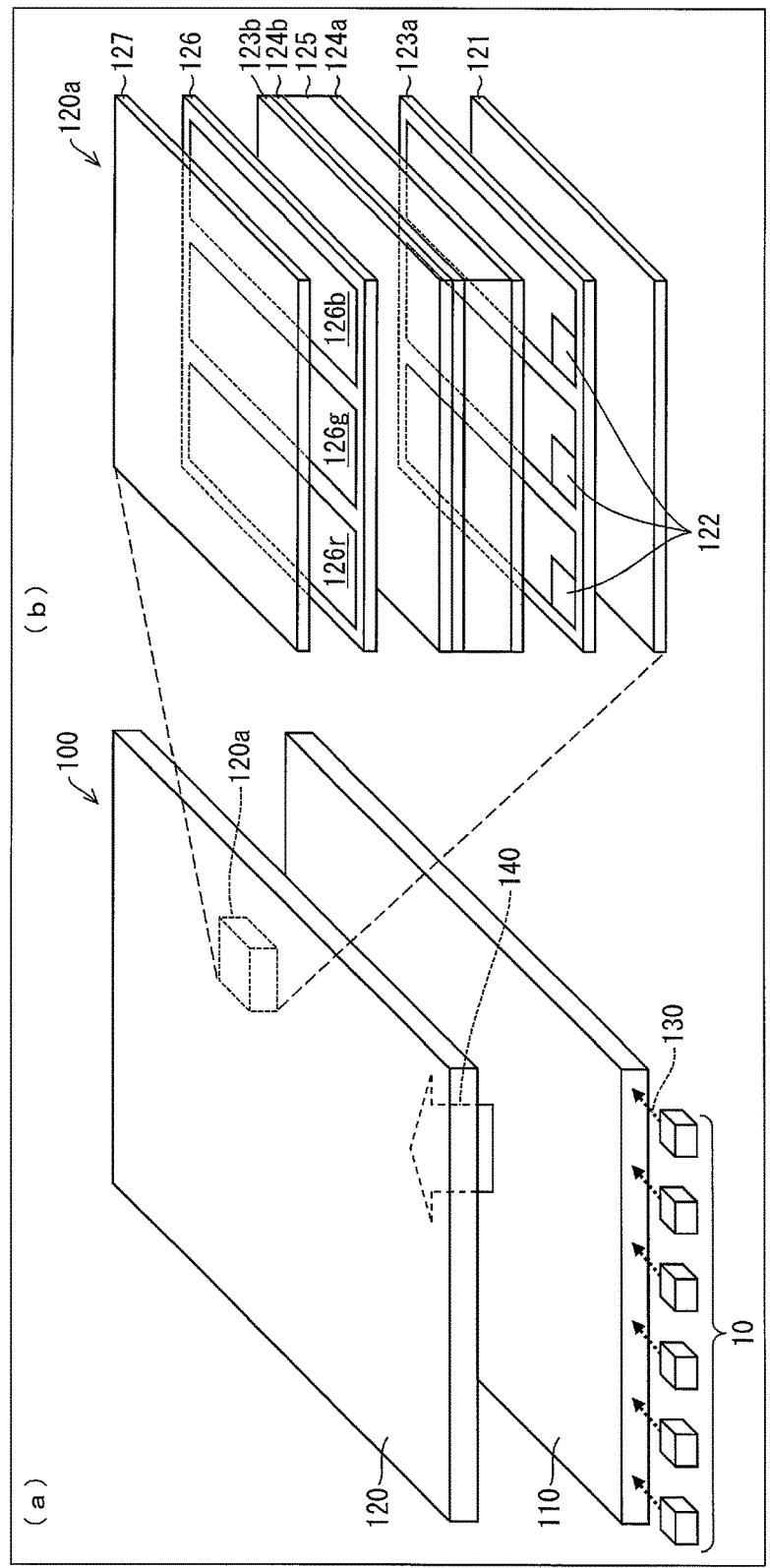

(a) of FIG. 9 is an exploded perspective view of an image display apparatus in accordance with Embodiment 2 of the present invention, and (b) of FIG. 9 is an exploded perspective view of a liquid crystal display device of the image display apparatus illustrated in (a) of FIG. 9.

Figure 10:
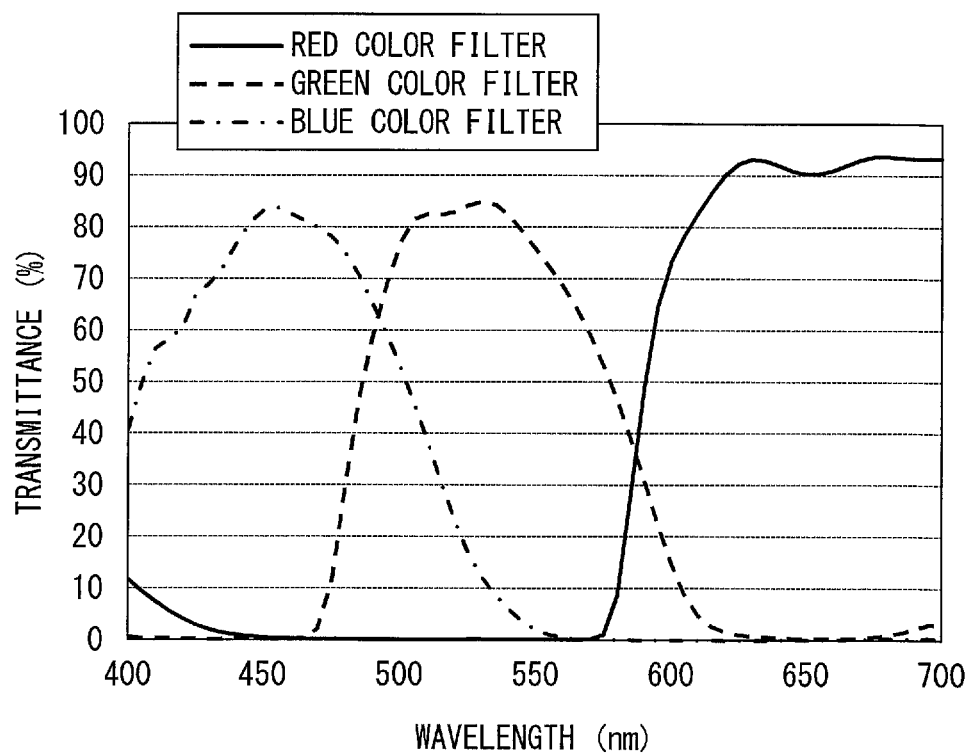

FIG. 10 is a graph that shows a transmission spectrum of a color filter.

FIG. 11 is a table that shows coverages, area ratios, and chromaticity coordinates of each of image display apparatuses of Examples and Comparative Examples in accordance with Embodiment 2 of the present invention.

Figure 12:
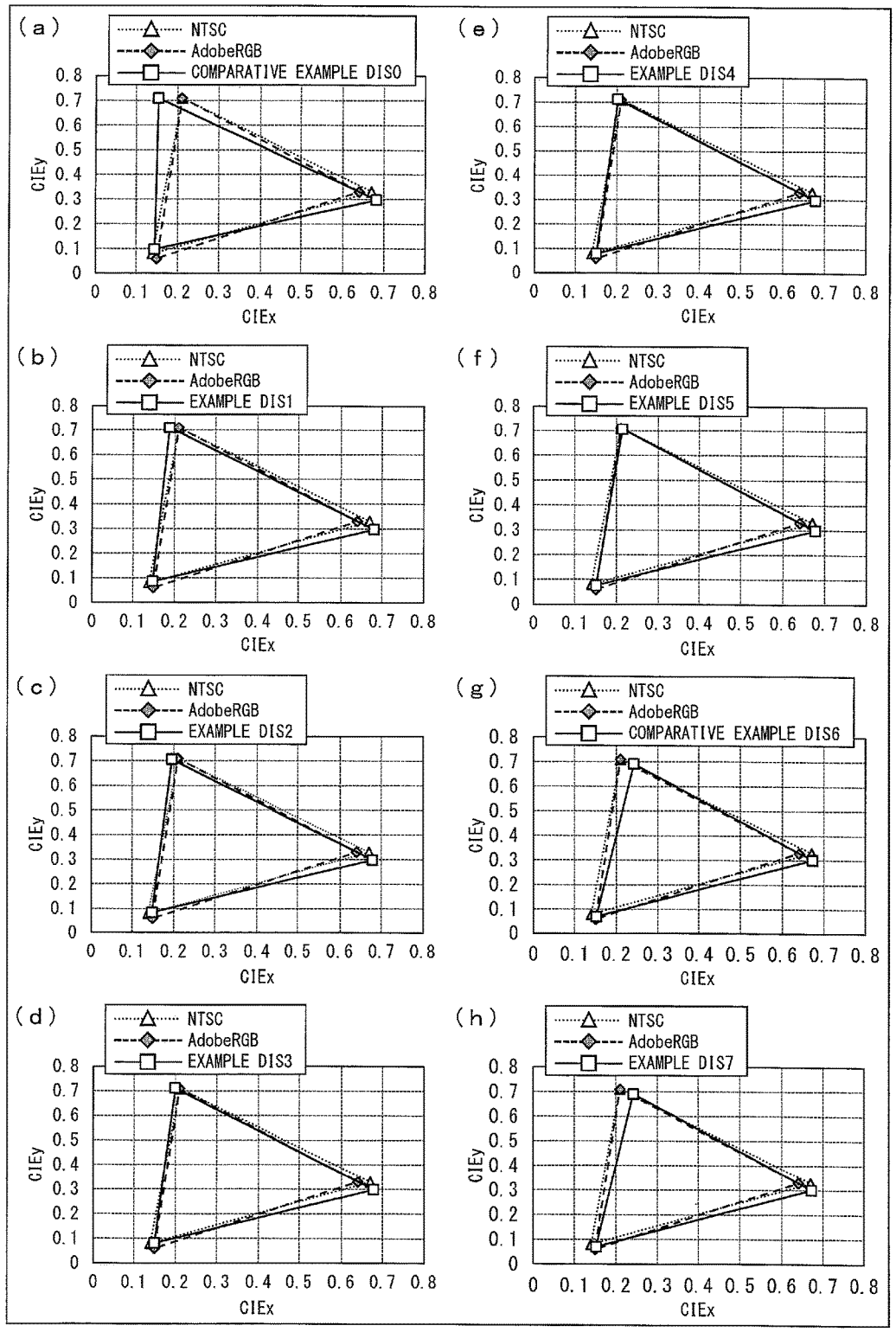

(a) through (h) of FIG. 12 are each a graph for comparing, with the NTSC color gamut and the Adobe RGB color gamut, a color gamut of each of the image display apparatuses of Examples and Comparative Examples in accordance with Embodiment 2 of the present invention.

Figure 13:
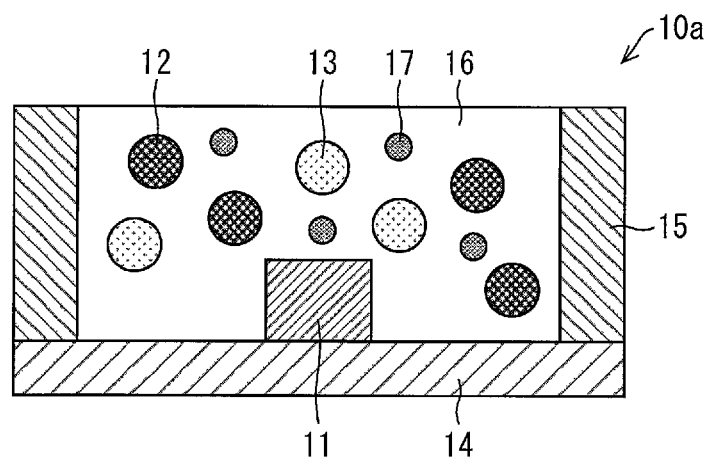

FIG. 13 is a cross-sectional view of a light emitting device in accordance with Embodiment 3 of the present invention.

FIG. 14 a table that shows, for each of light emitting devices in accordance with Embodiments 4 and 6 of the present invention, (i) a mixing ratio of a green phosphor to a red phosphor both dispersed in a dispersion medium (resin), (ii) a mixing ratio of the dispersion medium to the combination of the green phosphor and the red phosphor, and (iii) a luminous efficiency.

Figure 15:
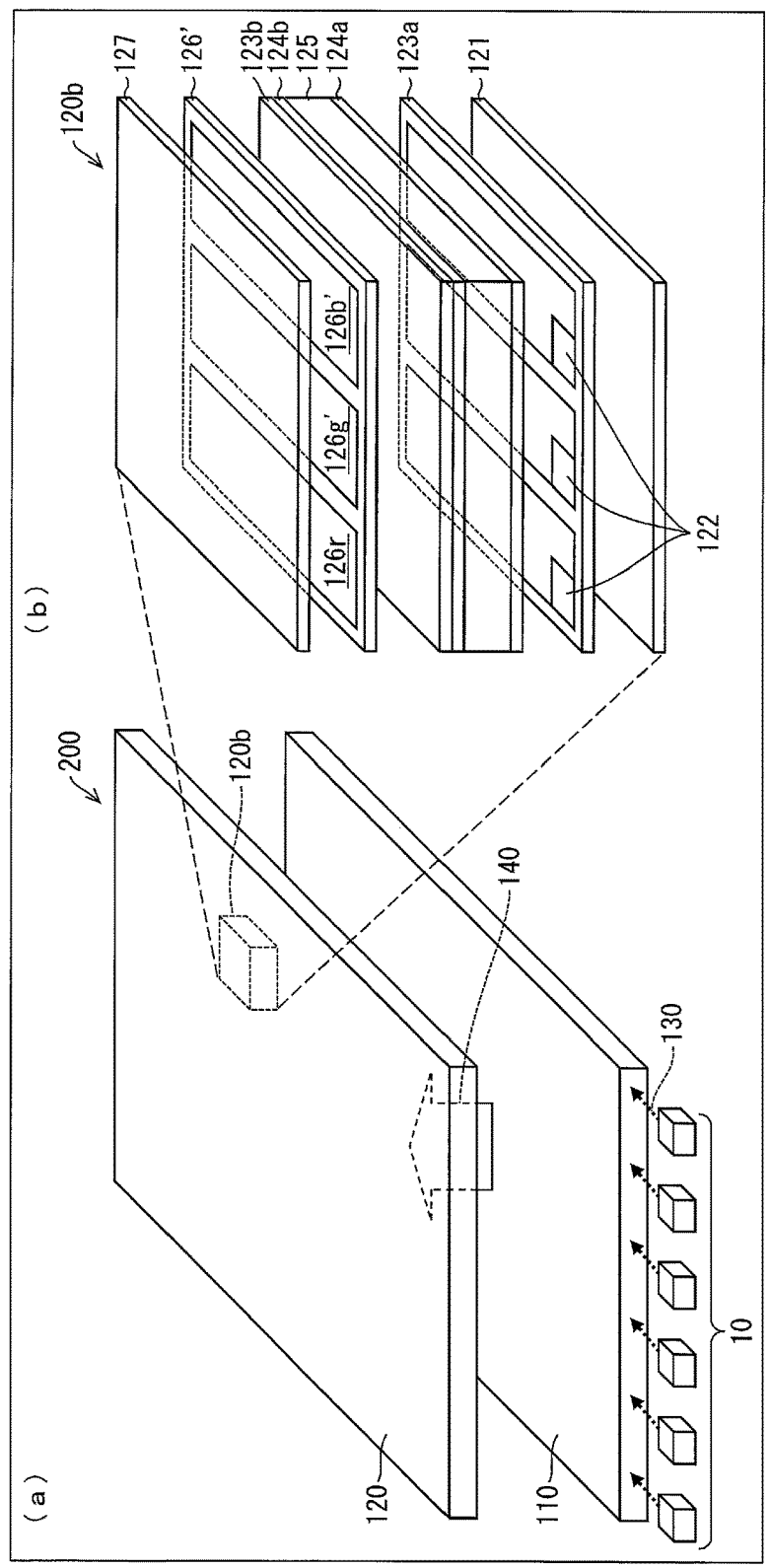

(a) of FIG. 15 is an exploded perspective view of an image display apparatus in accordance with Embodiment 5 of the present invention, and (b) of FIG. 15 is an exploded perspective view of a liquid crystal display device of the image display apparatus illustrated in (a) of FIG. 15.

Figure 16:
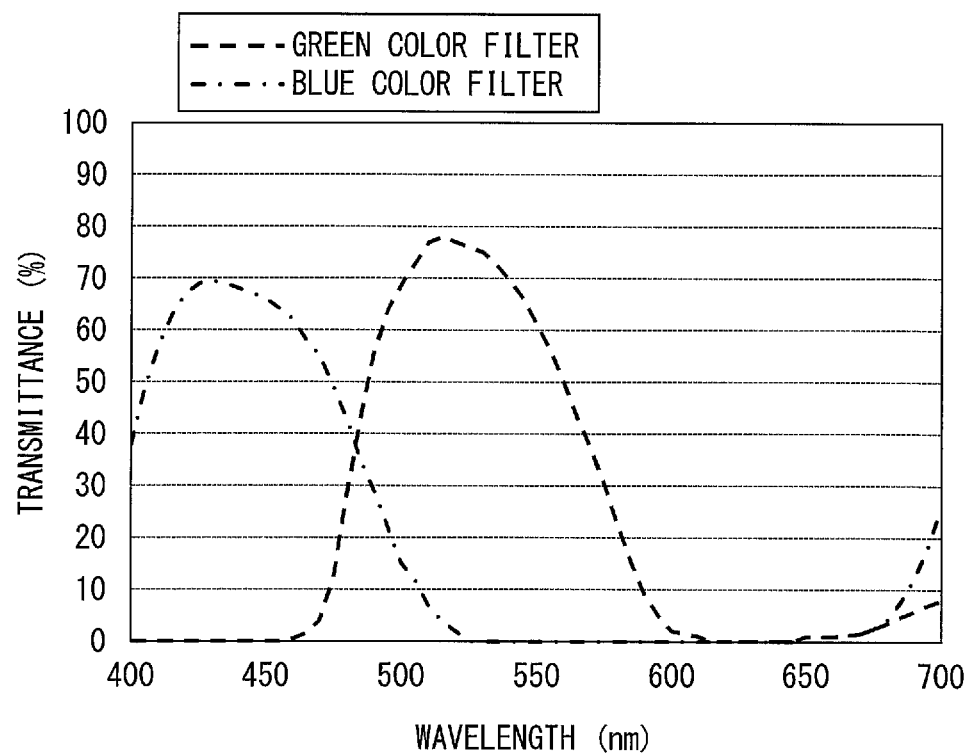

FIG. 16 is a graph that shows a transmission spectrum of a color filter.

FIG. 17 is a table that shows, for a light emitting device of an Example in accordance with Embodiment 5 of the present invention, (i) a mixing ratio of a green phosphor to a red phosphor both dispersed in a dispersion medium (resin) and (ii) a mixing ratio of the dispersion medium to the combination of the green phosphor and the red phosphor.

FIG. 18 is a table that shows coverages, area ratios, and chromaticity coordinates of an image display apparatus of the Example in accordance with Embodiment 5 of the present invention.

DESCRIPTION OF EMBODIMENTS

The following description will discuss embodiments of the present invention in detail. One aspect of the present invention can be described to have any of the following configurations (1) to (3) as a main configuration.

(1) Light emitting devices 10 and 10a in accordance with one aspect of the present invention each include: a light emitting element 11 that emits blue light; a green phosphor 13 that emits green light in response to excitation by the blue light; and a red phosphor 12 that emits red light in response to excitation by the blue light. In one aspect of the present invention, the green phosphor 13 is a $Mn^{2+}$-activated γ-AlON phosphor and the red phosphor 12 is a $Mn^{4+}$-activated phosphor. Further, the green light emitted by the $Mn^{2+}$-activated γ-AlON phosphor has an emission-spectrum peak wavelength of not less than 518 nm and not more than 528 nm.

The inventors of the present invention made diligent research and as a result, found that in a case where the above phosphors are used in combination and the emission-spectrum peak wavelength of the green light is in the above range, it is possible to increase an NTSC color gamut coverage and an Adobe RGB color gamut coverage.

(2) Light emitting devices 10 and 10a in accordance with one aspect of the present invention each include: a light emitting element 11 that emits blue light; a green phosphor 13 that emits green light in response to excitation by the blue light; and a red phosphor 12 that emits red light in response to excitation by the blue light. In one aspect of the present invention, the green phosphor 13 is a $Mn^{2+}$-activated γ-AlON phosphor and the red phosphor 12 is a $Mn^{4+}$-activated phosphor. Further, the $Mn^{2+}$-activated γ-AlON phosphor has a Mn concentration of not less than 1.5 wt % and not more than 4.5 wt % in a crystal of the $Mn^{2+}$-activated γ-AlON phosphor.

The inventors of the present invention made diligent research and as a result, found that in a case where the above phosphors are used in combination and the Mn concentration is not less than 1.5 wt %, it is possible to increase an NTSC color gamut coverage and an Adobe RGB color gamut coverage.

(3) Light emitting devices 10 and 10a in accordance with one aspect of the present invention each include: a light emitting element 11 that emits blue light; a green phosphor 13 that emits green light in response to excitation by the blue light; and a red phosphor 12 that emits red light in response to excitation by the blue light. In one aspect of the present invention, the green phosphor 13 is a $Mn^{2+}$-activated γ-AlON phosphor and the red phosphor 12 is a $Mn^{4+}$-activated phosphor. Further, the green light emitted by the $Mn^{2+}$-activated γ-AlON phosphor has an emission-spectrum half width of not less than 35 nm and not more than 50 nm.

The inventors of the present invention made diligent research and as a result, found that in a case where the above phosphors are used in combination and the emission-spectrum half width of the green light is in the above range, it is possible to increase an NTSC color gamut coverage and an Adobe RGB color gamut coverage.

The following description will discuss in detail the matters as described in the above (1) to (3), which are found by the inventors of the present invention.

Embodiment 1

The following description will discuss Embodiment 1 of the present invention with reference to FIGS. 1 through 8. Embodiment 1 described here is a light emitting device 10, which can be used as a backlight device for an image display apparatus so that an image display apparatus having a high luminous efficiency and a wide color reproduction range can be provided.

(Light Emitting Device 10)

Figure 1:
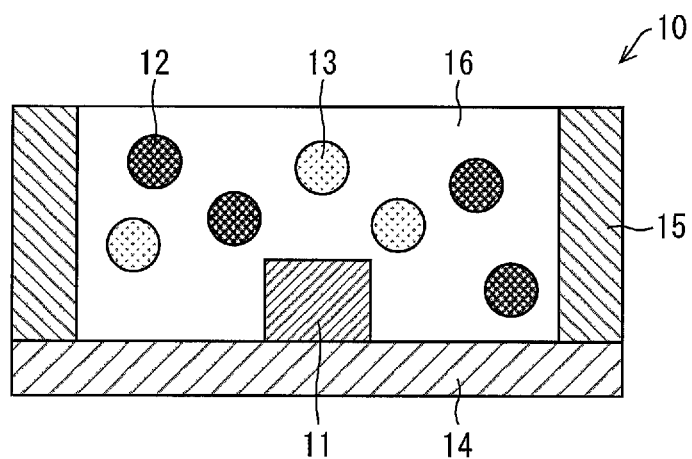
FIG. 1 is a cross-sectional view of a light emitting device in accordance with Embodiment 1 of the present invention.

FIG. 1 is a cross-sectional view of the light emitting device 10. As illustrated in FIG. 1, the light emitting device 10 includes a light emitting element 11, a red phosphor 12, a green phosphor 13, a printed wiring board 14, a resin frame 15, and a dispersion medium 16.

(Light Emitting Element 11)

The light emitting element 11 emits blue light. The light emitting element 11 may be any light emitting element that emits primary light (excitation light) consisting of blue light that is absorbed by a $Mn^{2+}$-activated γ-AlON phosphor (green phosphor 13) and a $Mn^{4+}$-activated phosphor (red phosphor 12) for generation of fluorescence. The light emitting element 11 is made of, for example, a gallium nitride (GaN)-based semiconductor.

The light emitting element 11 emits preferably primary light (excitation light) having a peak wavelength of preferably not less than 420 nm and not more than 480 nm, more preferably primary light (excitation light) having a peak wavelength of not less than 440 nm and not more than 460 nm.

In a case where the light emitting element 11 emits primary light (excitation light) having a peak wavelength of not less than 420 nm and not more than 480 nm, the red phosphor 12 and the green phosphor 13 each have a high excitation efficiency, which means that the light emitting element 11 has a high luminous efficiency. In a case where the light emitting element 11 emits primary light (excitation light) having a peak wavelength of not less than 440 nm and not more than 460 nm, the light emitting element 11 has a particularly high luminous efficiency, and such a peak wavelength is well-matched with the excitation spectrum of the red phosphor 12 described later and with the transmission spectrum of a blue color filter 126b described later. This allows the light emitting device 10 to have an improved luminous efficiency.

(Red phosphor 12)

The red phosphor 12 is a wavelength conversion member that is excited by blue light from the light emitting element 11 to emit red light. The red phosphor 12 is, specifically, a $Mn^{4+}$-activated phosphor.

The $Mn^{4+}$-activated phosphor can be selected as appropriate from among a $Mn^{4+}$-activated fluorine complex phosphor, a $Mn^{4+}$-activated oxide phosphor, a $Mn^{4+}$-activated acid fluoride phosphor, and the like. The $Mn^{4+}$-activated phosphor is preferably a $Mn^{4+}$-activated fluorine complex phosphor among others. This is because (i) a $Mn^{4+}$-activated fluorine complex phosphor emits red light having a small emission-spectrum half width of, for example, not more than 10 nm and has an excellent color reproducibility in the red range and (ii) a $Mn^{4+}$-activated fluorine complex phosphor has a high excitation efficiency with respect to blue light.

The red phosphor 12 can be, for example, a $Mn^{4+}$-activated fluorine complex phosphor represented by General Formula (A) or (B) below. Such a $Mn^{4+}$-activated fluorine complex phosphor, whether it is represented by General Formula (A) or (B), has an extremely small emission-spectrum half width of not more than 10 nm as described above. This is attributed to the properties of $Mn^{4+}$ as a light-emitting ion.

$$MI_2(MII_{1-h}Mn_h)F_6 \quad \text{General Formula (A):}$$

In the General Formula (A) above, (i) MI represents at least one alkali metal element selected from the group consisting of Li, Na, K, Rb, and Cs, (ii) MII represents at least one tetravalent metallic element selected from the group consisting of Ge, Si, Sn, Ti, and Zr, and (iii) preferably 0.001≤h≤0.1.

In the General Formula (A), MI preferably represents K for a high emission intensity and high stability of a phosphor crystal. Further, MII preferably contains Ti or Si for a similar reason.

Further, in the General Formula (A), the value of h indicates the composition ratio (concentration) of Mn, that is, the concentration of $Mn^{4+}$. A value of h of less than 0.001 disadvantageously leads to an insufficient concentration of $Mn^{4+}$ as a light-emitting ion, which consequently results in insufficient brightness. A value of h of more than 0.1 disadvantageously causes, for example, concentration quenching, which consequently leads to significant reduction in brightness.

Therefore, the $Mn^{4+}$-activated fluorine complex phosphor represented by the General Formula (A) is preferably $K_2(Ti_{1-h}Mn_h)F_6$ or $K_2(Si_{1-h}Mn_h)F_6$, where h is not less than 0.001 and not more than 0.1.

$$MIII(MIII_{1-h}Mn_h)F_6 \quad \text{General Formula (B):}$$

In the General Formula (B) above, (i) MIII represents at least one alkaline-earth metal element selected from the group consisting of Mg, Ca, Sr, and Ba, (ii) MII represents at least one tetravalent metallic element selected from the group consisting of Ge, Si, Sn, Ti, and Zr, and (iii) preferably 0.001≤h≤0.1.

In the General Formula (B), MIII preferably contains at least Ba because such a phosphor has a high luminous efficiency and is less likely to be degraded by heat or external force. Further, MII preferably contains Ti or Si for a similar reason.

In particular, no matter whether the $Mn^{4+}$-activated fluorine complex phosphor is represented by General Formula (A) or General Formula (B), MII is more preferably Si because such a phosphor has low solubility in water and high resistance to water. Further, in the General Formula (B), the value of h, which indicates the composition ratio (concentration) of Mn, is preferably 0.001≤h≤0.1 as with h in the General Formula (A) above.

(Green Phosphor 13)

The green phosphor 13 is a wavelength conversion member that is excited by blue light from the light emitting element 11 to emit green light. The green phosphor 13 is, specifically, a $Mn^{2+}$-activated γ-AlON phosphor.

The green phosphor 13 of Embodiment 1 is a $Mn^{2+}$-activated γ-AlON represented by the composition formula $M_aA_bAl_cO_dN_e$, where (i) M represents one or more metallic elements at least including Mn among Mn, Ce, Pr, Nd, Sm, Eu, Gd, Tb, Dy, Tm, and Yb, (ii) A represents one or more metallic elements except for M or Al, and (iii) a+b+c+d+e=1. The green phosphor 13 is suitably a $Mn^{2+}$-activated γ-AlON whose composition satisfies all of the conditions (1) to (5) below.

$$0.00001 \leq a \leq 0.1 \quad (1)$$

$$0 \leq b \leq 0.40 \quad (2)$$

$$0.10 \leq c \leq 0.48 \quad (3)$$

$$0.25 \leq d \leq 0.60 \quad (4)$$

$$0.02 \leq e \leq 0.35 \quad (5)$$

Further, the $Mn^{2+}$-activated γ-AlON phosphor as the green phosphor 13 emits green light having an emission-spectrum peak wavelength of not less than 518 nm (preferably not less than 520 nm) and not more than 528 nm. Stated differently, the $Mn^{2+}$-activated γ-AlON phosphor as the green phosphor 13 emits green light having an emission-spectrum half width of not less than 35 nm and not more than 50 nm (preferably not more than 45 nm).

The $Mn^{2+}$-activated γ-AlON phosphor can emit green light having an emission spectrum with a peak wavelength of not less than 518 nm and not more than 528 nm and a half width of not less than 35 nm and not more than 50 nm in a case where, for example, appropriate control is exercised of a designed composition or a production condition such as a firing condition for the $Mn^{2+}$-activated γ-AlON phosphor.

Further, the $Mn^{2+}$-activated γ-AlON phosphor can emit green light having an emission spectrum with a peak wavelength and a half width in the respective ranges above in a case where a crystal of the $Mn^{2+}$-activated γ-AlON phosphor has a Mn concentration of not less than 1.5 wt % (weight %) and not more than 4.5 wt % (preferably not more than 3.1 wt %). The $Mn^{2+}$-activated γ-AlON phosphor can have a Mn concentration of at least 1.5 weight % also in a case where, for example, appropriate control is exercised of a designed composition or a production condition such as a firing condition for the $Mn^{2+}$-activated γ-AlON phosphor. This means that the $Mn^{2+}$-activated γ-AlON phosphor as the green phosphor 13 has a Mn concentration (that is, the crystal of the $Mn^{2+}$-activated γ-AlON phosphor as a finished product have a Mn concentration) of not less than 1.5 wt % and not more than 4.5 wt %.

As described above, the light emitting device 10 includes, as the green phosphor 13 for use as a wavelength conversion member, the $Mn^{2+}$-activated γ-AlON phosphor having an emission spectrum controlled appropriately as described above. Accordingly, an image display apparatus including the light emitting device 10 can have a large coverage of a wide color gamut such as the NTSC color gamut and the Adobe RGB color gamut, as described later. In other words, an image display apparatus including the light emitting device 10 can have a suitably shaped chromaticity diagram (that is, the large coverage) for the image display apparatus as illustrated in, for example, (b) through (f) and (h) of FIG. 12.

The color gamut of an image display apparatus can be adjusted with use of a technique A described in (1) below or a technique B described in (2) below: (1) a technique (technique A) including adjusting the emission spectrum of light emitted by a wavelength conversion member included in the light emitting device (for example, fluorescence emitted by a phosphor contained in the wavelength conversion member); and (2) a technique (technique B) including adjusting the transmission spectrum of a color filter for light passing therethrough by adjustment of pigments in the color filter. The technique B is disclosed in, for example, Patent Literature 3.

In order to improve both the luminous efficiency and the color reproduction range of an image display apparatus, the color gamut for green of the image display apparatus is preferably adjusted by the method including adjusting the emission spectrum of light emitted by the green phosphor 13 as in the technique A. Further, the emission spectrum is preferably finely adjusted with a high accuracy in the nanometer order.

Figure 2:
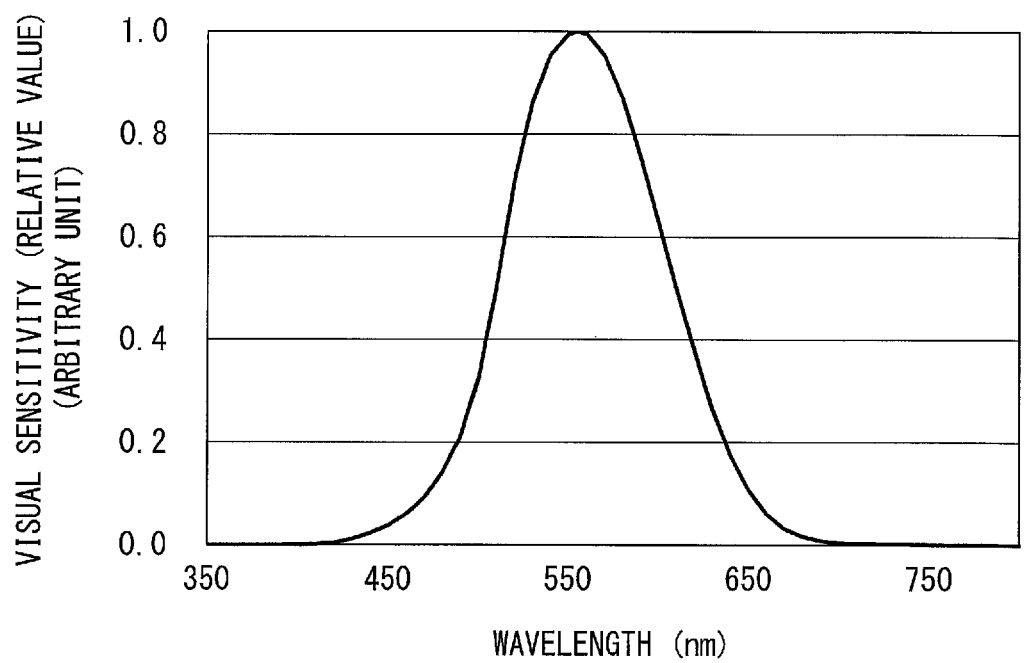
FIG. 2 is a graph that shows the human visual sensitivity curve.

FIG. 2 shows that the human visual sensitivity curve has a peak wavelength at 555 nm in the green range. Thus, in a case where, for example, the transmittance of a green color filter is adjusted (that is, the technique B is used) for an increased color gamut for green, the green color filter undesirably reduces a spectral component in the green range which spectral component has a relatively high visual sensitivity in the emission spectrum of the light emitting device. Adjusting the transmission spectrum of a color filter as in the technique B may thus result in decreased luminous efficiency for an image display apparatus including the light emitting device.

In view of the above, the inventors of the present invention adjusted the emission spectrum of the green phosphor 13 as in the technique A in an effort to produce a light emitting device that would allow an image display apparatus to have a wide color reproduction range (that is, a large coverage of the NTSC color gamut and the Adobe RGB color gamut). Specifically, the inventors of the present invention repeatedly prototyped a $Mn^{2+}$-activated γ-AlON phosphor as a green phosphor, and also repeatedly prototyped (i) a light emitting device that combined the prototyped $Mn^{2+}$-activated γ-AlON phosphor and a $Mn^{4+}$-activated phosphor and (ii) an image display apparatus including such a light emitting device. The inventors of the present invention have then, as a result of diligent research, encountered the problem below from the results of measurements of the emission spectra of the prototyped $Mn^{2+}$-activated γ-AlON phosphors, light emitting devices, and image display apparatuses.

Specifically, the inventors of the present invention have encountered the following problem: In a case where a light emitting device includes a $Mn^{2+}$-activated γ-AlON phosphor that emits green light having an emission spectrum with a half width smaller than a predetermined value, the emission spectrum of the green light has a peak wavelength shorter than preferable. This causes the image display apparatus to have a decreased coverage of the NTSC color gamut or the Adobe RGB color gamut.

More specifically, the inventors of the present invention have encountered the following problem: In a case where the $Mn^{2+}$-activated γ-AlON phosphor emits green light having an emission-spectrum half width of less than 35 nm, the emission spectrum of the green light has a peak wavelength shorter than preferable. This leads to a decreased coverage. With the half width of less than 35 nm, a peak wavelength shorter than preferable results in a decreased coverage because an image display apparatus including such a green phosphor emits light having an emission spectrum whose chromaticity point for green (green point) unfortunately has a small chromaticity coordinate CIEx.

In other words, the inventors of the present invention have discovered that the half width of less than 35 nm decreases color reproducibility for the green range in the NTSC color gamut or Adobe RGB color gamut. The inventors of the present invention have, conversely speaking, discovered the following: In a case where the half width is not less than 35 nm, the peak wavelength is not less than 518 nm, or the Mn concentration is not less than 1.5 wt %, the coverage is improved, so that the image display apparatus has a wide color reproduction range.

It is publicly known that for conventionally publicly known green phosphors such as a Eu-activated β-SiAlON phosphor as well, a higher concentration of an activator in a crystal changes the emission spectrum, for example, causes the emission spectrum to have a longer peak wavelength and a larger half width. The dependence of such a change in the emission spectrum on the concentration of an activator, however, varies according to the kind of the activator and the kind of a matrix material, and varies greatly according to the combination of an individual activator and a matrix material.

For example, the $Mn^{2+}$-activated γ-AlON phosphors used in one aspect of the present invention tend to have an emission spectrum with a longer peak wavelength and a larger half width at a higher Mn concentration in the crystal (see FIG. 4). On the other hand, for example, a comparison between the Production Examples P2 and P3 shows that the $Mn^{2+}$-activated γ-AlON phosphor behaves in a manner contrary to a typical manner, that is, at a larger Mn concentration, an emission-spectrum peak wavelength is longer whereas a half width is smaller. The inventors of the present invention have specified a range of the half width of the emission-spectrum peak wavelength by also studying the unique properties of a $Mn^{2+}$-activated γ-AlON in particular.

It is generally thought that a smaller emission-spectrum half width of each color of red, green, and blue allows for a wider color reproduction range for an image display apparatus. In other words, it is conventionally publicly known common technical knowledge that a $Mn^{2+}$-activated γ-AlON phosphor having a Mn concentration set at a low value emits green light having an emission spectrum shaped preferably for the purpose of allowing an image display apparatus to have a wider color reproduction range. Embodiment 1 is, as described above, configured such that a green phosphor having a Mn concentration set at a high value is prepared so that the green phosphor will have an emission-spectrum half width of not less than a given value. This design concept is contrary to the conventional design concept for a light emitting device and an image display apparatus each including a light-emitting element activated phosphor. This is presumably because in the case of the $Mn^{2+}$-activated γ-AlON phosphor of one aspect of the present invention, the characteristics of the image display apparatus are more strongly influenced by a change in the peak wavelength than by a change in the half width when the emission spectrum changes due to an increase in the concentration of an activator.

In a case where the $Mn^{2+}$-activated γ-AlON phosphor emits green light having an emission-spectrum half width of more than 50 nm (that is, with a peak wavelength of more than 528 nm), the coverage is decreased. This is because in a case where the $Mn^{2+}$-activated γ-AlON phosphor emits green light having an emission spectrum with a half width of more than 50 nm (that is, with a peak wavelength of more than 528 nm), an image display apparatus including the $Mn^{2+}$-activated γ-AlON phosphor is only capable of displaying an image in a small color gamut and consequently has a decreased coverage. In this case, the $Mn^{2+}$-activated γ-AlON phosphor has a Mn concentration of more than 4.5 wt %.

In Embodiment 1, the $Mn^{2+}$-activated γ-AlON phosphor emits green light having an emission-spectrum half width of not less than 35 nm and not more than 50 nm and an emission-spectrum peak wavelength of not less than 518 nm and not more than 528 nm. Further, in order to have the above half width and peak wavelength, the $Mn^{2+}$-activated γ-AlON phosphor has a Mn concentration of not less than 1.5 wt % and not more than 4.5 wt %.

Green light emitted by the $Mn^{2+}$ activated γ-AlON phosphor and having an emission spectrum as described above, has a wavelength well-matched with the transmission spectrum of the green color filter. This allows an image display apparatus including the light emitting device 10 to have an improved luminous efficiency.

In addition, green light emitted by the $Mn^{2+}$-activated γ-AlON phosphor and having a peak wavelength as described above, has an x chromaticity coordinate CIEx of not less than 0.180 and not more than 0.260 (preferably not more than 0.225) as described later. The $Mn^{2+}$-activated γ-AlON phosphor thus emits green light having a wavelength well-matched with the green point in a color gamut such as the Adobe RGB color gamut or the NTSC color gamut. This allows an image display apparatus including the light emitting device 10 to have a larger Adobe RGB color gamut coverage or a larger NTSC color gamut coverage than conventional image display apparatuses.

Further, even in a case where the $Mn^{2+}$-activated γ-AlON emits green light having a large emission-spectrum half width of not less than 35 nm and a long peak emission-spectrum wavelength of not less than 518 nm as in Embodiment 1, an image display apparatus including such a $Mn^{2+}$-activated γ-AlON is not likely to have decreased color reproducibility for green and red in the Adobe RGB color gamut or the NTSC color gamut. This is attributed to the use of a $Mn^{4+}$-activated phosphor as the red phosphor 12, which $Mn^{4+}$-activated phosphor emits red light having a particularly small emission-spectrum half width.

The use of the $Mn^{2+}$-activated γ-AlON that emits green light having an emission spectrum with a half width of not less than 35 nm and a peak wavelength of not less than 518 nm further produces an additional effect of allowing an image display apparatus to have increased color stability.

In the case of the $Mn^{2+}$-activated γ-AlON phosphor that emits green light having an emission spectrum with the above half width and peak wavelength, an excitation spectrum of the $Mn^{2+}$-activated γ-AlON phosphor has a peak wavelength (excitation peak wavelength) with a larger half width, which peak wavelength is at or around 445 nm that is important for excitation by blue light (that is, within the wavelength range of blue light). Thus, even in a case where a change in an environmental factor such as temperature or drive current has changed the peak wavelength of blue light that the light emitting element 11 emits, such an environmental change does not easily change the excitation efficiency of the green phosphor 13, that is, does not easily change the chromaticity of light that the light emitting device 10 emits. The above configuration thus allows an image display apparatus to have increased color stability.

The $Mn^{2+}$-activated γ-AlON phosphor, among other phosphors, has an excitation spectrum with a sharp peak shape; in particular, the excitation spectrum has a particularly small half width in an excitation band at and around 445 nm. Accordingly, it is a property particularly important for practical use of a $Mn^{2+}$-activated γ-AlON phosphor that an excitation spectrum has a larger half width of a peak wavelength at or around 445 nm as described above.

As described above, the $Mn^{2+}$-activated γ-AlON phosphor has a Mn concentration of not less than 1.5 wt %. This means that the crystal of the $Mn^{2+}$-activated γ-AlON phosphor contains more Mn. Such a $Mn^{2+}$-activated γ-AlON phosphor has an increased absorbance for excitation light, which additionally produces an effect of allowing the light emitting device 10 to have an improved luminous efficiency.

In order for a γ-AlON crystal to contain more Mn within the above concentration range, A in the above composition formula $M_aA_bAl_cOdN_e$ is preferably a bivalent metallic element such as Mg, Zn or Ca, particularly preferably Mg among others.

In a case where the $Mn^{2+}$-activated γ-AlON phosphor contains Mg, the γ-AlON crystal has a stabilized crystal structure and can easily contain Mn. This allows the $Mn^{2+}$-activated γ-AlON to have a further improved luminous efficiency.

The index of the Mn concentration in the crystal of the $Mn^{2+}$-activated γ-AlON phosphor (the concentration of Mn taken into the crystal of the $Mn^{2+}$-activated γ-AlON phosphor) differs from the index of the Mn concentration in a designed composition. The Mn concentration in a designed composition is calculated from the mixing ratio of raw material powders. In other words, the Mn concentration in the $Mn^{2+}$-activated γ-AlON phosphor refers to the Mn concentration in the crystal of the $Mn^{2+}$-activated γ-AlON phosphor as a finished product.

Since Mn has high volatility, Mn is easily volatilized during a high-temperature firing process and accordingly is easily taken into a glassy phase or a heterogeneous phase outside the γ-AlON crystal. Thus, the index of the concentration of Mn that is actually contained in the γ-AlON crystal and that contributes to light emission preferably refers to not (i) a value calculated from a designed composition but (ii) a direct measurement of the Mn concentration at, for example, a cross section of a crystal of the $Mn^{2+}$-activated γ-AlON. The above index is, in other words, preferably a calculated value of the concentration of Mn actually contained in the crystal.

(Other Members Included in Light Emitting Device 10)

The printed wiring board 14 is a substrate that supports the light emitting element 11 placed thereon and that is provided with an electric circuit for driving the light emitting element 11. The resin frame 15 is a frame made of resin and is placed on the printed wiring board 14.

The dispersion medium 16 seals the light emitting element 11. The dispersion medium 16 also contains both the red phosphor 12 and the green phosphor 13 dispersed therein. The dispersion medium 16 fills the space surrounded by the resin frame 15.

The dispersion medium 16 may be made of any material, which is selected as appropriate from among, for example, (i) a light-transmitting resin material such as a methyl-based silicone resin, a phenyl-based silicone resin, an epoxy resin, or an acrylic resin, (ii) a glass material such as low-melting glass, or (iii) an organic-inorganic hybrid glass. The dispersion medium 16 is preferably made of a resin material among others because such a dispersion medium 16 can be produced at a lower temperature.

The red phosphor 12 and the green phosphor 13, dispersed in the dispersion medium 16, may be mixed at any ratio. The mixing ratio may be selected as appropriate so as to make it possible to obtain an emission spectrum with a desired white point in a case where the color filters are fully opened in an image display apparatus including the light emitting device 10.

(Preparation of Green Phosphor)

Figure 3:
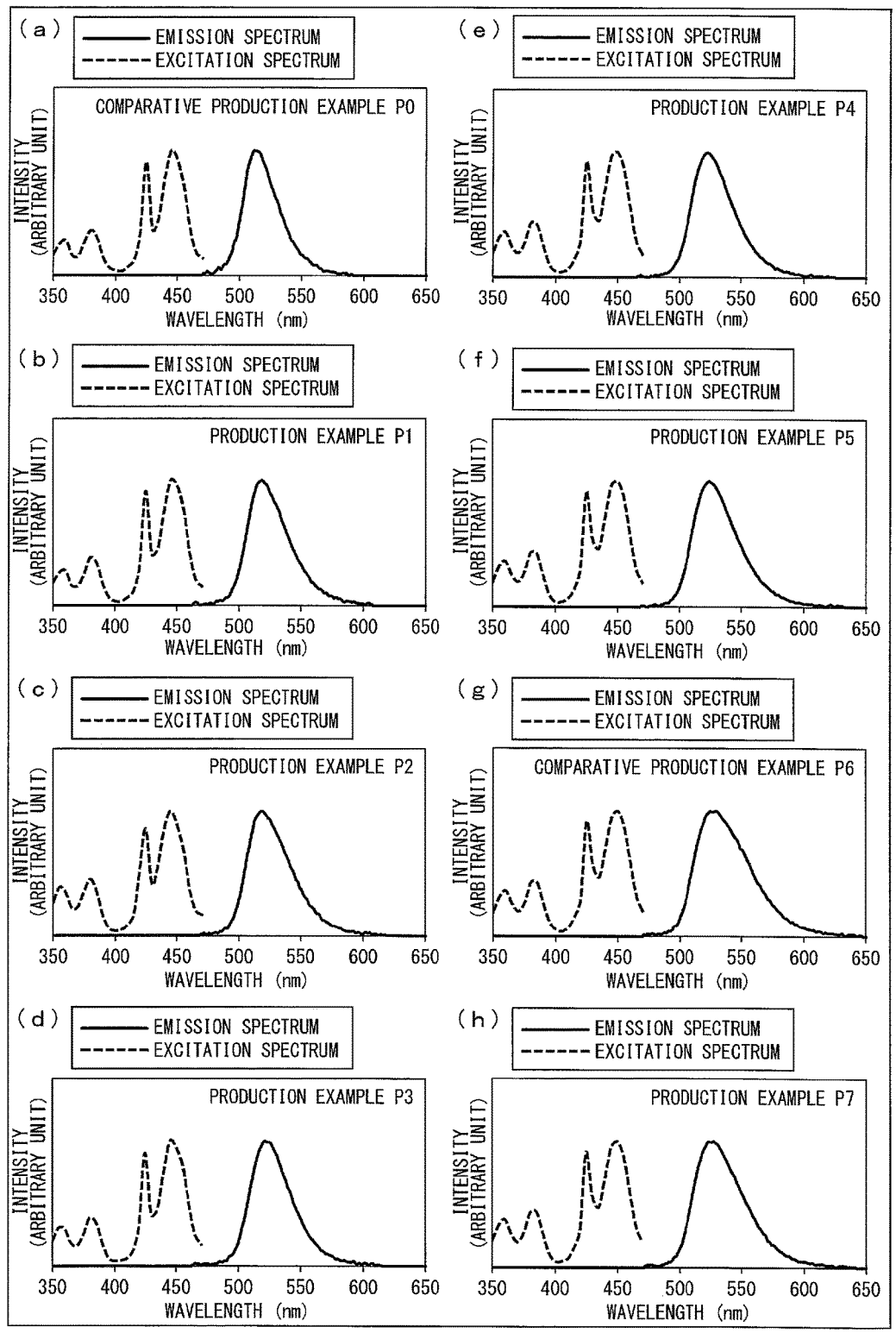
FIG. 3 provides graphs each of which shows an emission spectrum and an excitation spectrum of a green phosphor, where (a) and (g) are each a graph that shows an emission spectrum and an excitation spectrum of a green phosphor in accordance with a Comparative Production Example, and (b) through (f) and (h) are each a graph that shows an emission spectrum and an excitation spectrum of a green phosphor in accordance with a Production Example of Embodiment 1 of the present invention.

The following description will discuss Production Examples for the green phosphor 13 and their Comparative Examples with reference to FIGS. 3 and 4. (a) of FIG. 3 is a graph that shows an emission spectrum and an excitation spectrum of a green phosphor in accordance with Comparative Production Example P0. (g) of FIG. 3 is a graph that shows an emission spectrum and an excitation spectrum of a green phosphor in accordance with Comparative Production Example P6. (b) through (f) and (h) of FIG. 3 are each a graph that shows an emission spectrum and an excitation spectrum of a green phosphor 13 in accordance with a corresponding one of Production Examples P1 to P5 and P7. Specifically, (b) of FIG. 3 corresponds to Production Example P1. (c) of FIG. 3 corresponds to Production Example P2. (d) of FIG. 3 corresponds to Production Example P3. (e) of FIG. 3 corresponds to Production Example P4. (f) of FIG. 3 corresponds to Production Example P5. (h) of FIG. 3 corresponds to Production Example P7. FIG. 4 is a table that shows a mixing ratio of raw material powders and measurement results for each of the respective green phosphors in accordance with Comparative Production Examples P0 and P6 and the respective green phosphors 13 in accordance with Production Examples P1 to P5 and P7. Specifically, FIG. 4 shows the peak wavelength, the half width, and the chromaticity coordinates of each emission spectrum, the half width of a peak wavelength at or around 445 nm for each excitation spectrum, and the Mn concentration in the crystal of each green phosphor.

Figure 5:
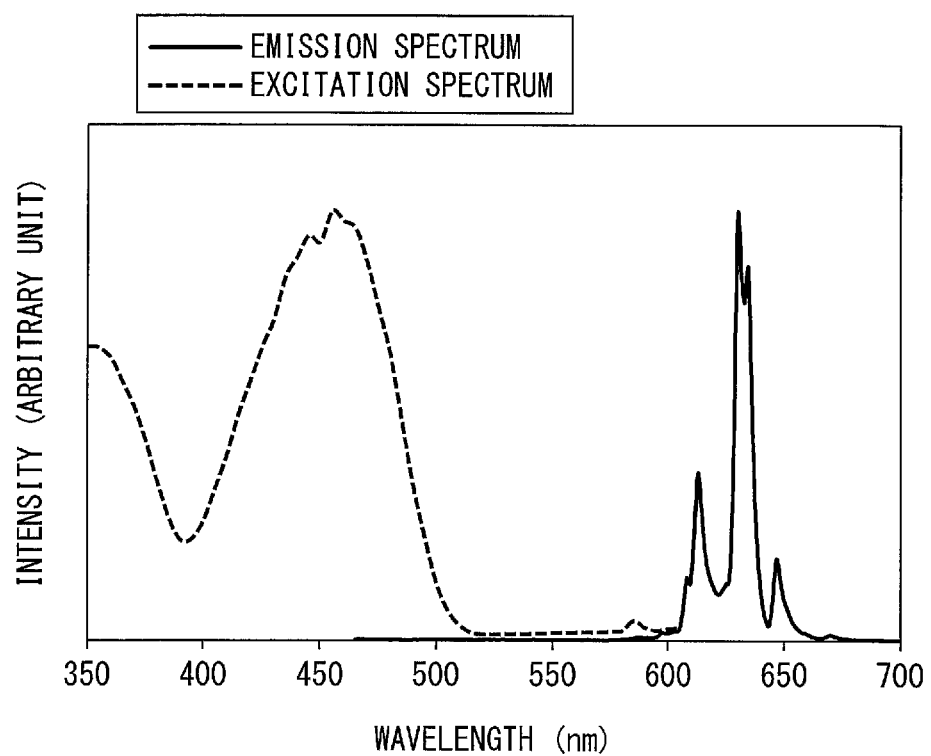
FIG. 5 is a graph that shows an emission spectrum and an excitation spectrum of a red phosphor in accordance with a Production Example of Embodiment 1 of the present invention.

(a) and (b) of FIG. 6 are graphs that integrate the graphs of FIGS. 3 and 5 (FIG. 5 is a graph that shows an emission spectrum and an excitation spectrum of the red phosphor 12 described later). Specifically, (a) of FIG. 6 is a graph that shows (i) the respective emission spectra of the green phosphor in accordance with Comparative Production Example P0 and the green phosphors 13 in accordance with Production Examples P1 to P5 and (ii) the excitation spectrum of the red phosphor 12. (b) of FIG. 6 is a graph that shows (i) the respective emission spectra of the green phosphor in accordance with Comparative Production Example P0 and the green phosphors 13 in accordance with Production Examples P1 to P5 and (ii) the emission spectrum of the red phosphor 12.

The graphs of FIGS. 3 and 6 each have a vertical axis representing an emission intensity (arbitrary unit) and a horizontal axis representing a wavelength (nm).

Comparative Production Example P0: Preparation of $Mn^{2+}$-Activated γ-AlON Phosphor With reference to (a) of FIG. 3, the following description will first discuss an Production Example (Comparative Production Example P0) for a green phosphor to be compared with the green phosphor 13 in accordance with Embodiment 1.

In order to prepare a $Mn^{2+}$-activated γ-AlON phosphor in accordance with Comparative Production Example P0, aluminum nitride powder, aluminum oxide powder, and manganese carbonate powder were mixed at the mixing ratio shown in FIG. 4.

Specifically, first, the aluminum nitride powder, the aluminum oxide powder, and the manganese carbonate powder were weighed out for obtaining a composition containing 12.66 mass % of aluminum nitride powder, 81.78 of mass % aluminum oxide powder, and 5.56 mass % of manganese carbonate powder. Next, the above ingredients were mixed for not shorter than 10 minutes with use of a mortar and a pestle each made of a silicon nitride sintered body, so that a powder aggregate was prepared. Then, the powder aggregate was let fall freely into a boron nitride crucible having a diameter of 20 mm and a height of 20 mm.

Next, the crucible was set in a pressure electric furnace based on a graphite resistance heating system. Then, nitrogen with a purity of 99.999% by volume was introduced into the pressure electric furnace, and the pressure inside the pressure electric furnace was set at 0.5 MPa. After that, the temperature of the pressure electric furnace was raised at a rate of 500° C. per hour up to 1800° C. The crucible was then kept in the pressure electric furnace at 1800° C. for 2 hours, so that a phosphor sample was prepared.

The phosphor sample prepared was ground in an agate mortar, and was then let pass through a sieve having a mesh size of 100 μm for removal of coarse particles. As a result, phosphor powder was prepared.

The phosphor powder prepared was subjected to powder X ray diffraction (XRD) involving use of a Kα ray of Cu. The charts obtained as the results of the XRD of the phosphor powder all indicated that the phosphor powder had a γ-AlON structure. Further, the phosphor powder was irradiated with light having a wavelength of 365 nm. This confirmed that the phosphor powder would emit green light in response to such irradiation. Through the above steps, $Mn^{2+}$-activated γ-AlON phosphor powder in accordance with Comparative Production Example P0 was prepared.

Next, the above-prepared green phosphor in accordance with Comparative Production Example P0 was irradiated with light having a wavelength of 445 nm, so that an emission spectrum shown in (a) of FIG. 3 was obtained. Specifically, this emission spectrum was measured by irradiating the green phosphor with light having a wavelength of 445 nm and thereby exciting the green phosphor, with use of a spectrophotometer (MCPD-7000, produced by Otsuka Electronics Co., Ltd.). The excitation spectrum was obtained by monitoring the peak wavelength of the emission spectrum.

The emission spectrum shown in (a) of FIG. 3 was analyzed, the result of which showed that the green phosphor in accordance with Comparative Production Example P0 had an emission spectrum with a peak wavelength of 515 nm and a half width of 33 nm as shown in FIG. 4. The emission spectrum was further referred to for calculation of chromaticity coordinates, which were (CIEx, CIEy)=(0.143, 0.727) on the CIE1931 chromaticity coordinates.

Next, a measurement was made of the Mn concentration in the crystal of the green phosphor in accordance with Comparative Production Example P0.

The Mn concentration in the crystal of the green phosphor was calculated as follows: First, the phosphor powder prepared through the above steps was dispersed in an epoxy resin (produced by JEOL Ltd.). Next, a cross-section processing device (produced by JEOL Ltd.) was used to emit an Ar ion beam to the epoxy resin (in which the phosphor powder was dispersed), so that phosphor particles in the epoxy resin were cut. After that, the Mn concentration was measured at a plurality of cross sections of the phosphor particles with use of an energy dispersive X-ray spectrometry (EDX) detector (energy-dispersive X-ray diffractometer; produced by AMETEK, Inc.) accessory to a scanning electron microscope (SEM), and the mean value of measurements obtained as a result was calculated as the Mn concentration.

The Mn concentration, calculated by the above method, in the crystal of the green phosphor in accordance with Comparative Production Example P0 was 0.45 wt % as shown in FIG. 4.

The green phosphor in accordance with Comparative Production Example P0 had an excitation spectrum whose half width of a peak wavelength at or around 445 nm was 22 nm as shown in FIG. 4.

Comparative Production Example P6: Preparation of $Mn^{2+}$-Activated γ-AlON Phosphor)

With reference to (g) of FIG. 3, the following description will discuss another Production Example (Comparative Production Example P6) for a green phosphor to be compared with the green phosphor 13 in accordance with Embodiment 1.

The green phosphor in accordance with Comparative Production Example P6 was prepared through steps similar to those for Comparative Production Example P0. Specifically, the green phosphor in accordance with Comparative Production Example P6 was prepared by mixing aluminum nitride powder, aluminum oxide powder, magnesium oxide powder, and manganese fluoride powder at the mixing ratio shown in FIG. 4. Next, the green phosphor in accordance with Comparative Production Example P6 was irradiated with light having a wavelength of 445 nm, so that an emission spectrum shown in (g) of FIG. 3 was obtained. Specifically, as in Comparative Production Example P0, this emission spectrum was obtained by irradiating the green phosphor with light having a wavelength of 445 nm and thereby exciting the green phosphor, with use of a spectrophotometer (MCPD-7000, produced by Otsuka Electronics Co., Ltd.). The excitation spectrum was obtained by monitoring the peak wavelength of the emission spectrum. Further, the Mn concentration in the crystal of the green phosphor in accordance with Comparative Production Example P6 was calculated by a method similar to that for Comparative Production Example P0.

As shown in FIG. 4, the green phosphor in accordance with Comparative Production Example P6 had an emission spectrum with a peak wavelength of 529 nm and a half width of 51 nm. The emission spectrum was further referred to for calculation of chromaticity coordinates, which were (CIEx, CIEy)=(0.262, 0.690) on the CIE1931 chromaticity coordinates. The Mn concentration in the crystal of the green phosphor in accordance with Comparative Production Example P6 was 4.56 wt %. The green phosphor had an excitation spectrum whose half width of a peak wavelength at or around 445 nm was 25.5 nm.

Production Examples P1 to P5 and P7: Preparation of $Mn^{2+}$-Activated γ-AlON Phosphors With reference to (b) through (f) and (h) of FIG. 3, the following description will discuss Production Examples (Production Examples P1 to P5 and P7) for the green phosphor 13 in accordance with Embodiment 1.

A $Mn^{2+}$-activated γ-AlON phosphor (green phosphor 13) in accordance with each of Production Examples P1 to P5 and P7 was prepared through steps similar to those for Comparative Production Example P0. Specifically, the green phosphor 13 in accordance with Production Example P1 was prepared by mixing aluminum nitride powder, aluminum oxide powder, magnesium oxide powder, and manganese carbonate powder at the mixing ratio shown in FIG. 4. The green phosphor 13 in accordance with Production Example P2 was prepared by mixing aluminum nitride powder, aluminum oxide powder, magnesium oxide powder, and manganese oxide powder at the mixing ratio shown in FIG. 4. The green phosphor 13 in accordance with each of Production Examples P3 to P5 and P7 was prepared by mixing aluminum nitride powder, aluminum oxide powder, magnesium oxide powder, and manganese fluoride powder at the corresponding mixing ratio shown in FIG. 4.

Next, the green phosphor 13 prepared in accordance with each of Production Examples P1 to P5 and P7 was irradiated with light having a wavelength of 445 nm, so that each of respective emission spectra shown in (b) through (f) and (h) of FIG. 3 was obtained. Specifically, as in Comparative Production Example P0, these emission spectra each were obtained by irradiating the green phosphor with light having a wavelength of 445 nm and thereby exciting the green phosphor, with use of a spectrophotometer (MCPD-7000, produced by Otsuka Electronics Co., Ltd.). The excitation spectra were obtained by monitoring the peak wavelengths of the respective emission spectra. Further, the Mn concentration in the crystal of the green phosphor 13 in accordance with each of Production Examples P1 to P5 and P7 was calculated by a method similar to that for Comparative Production Example P0.

FIG. 4 shows the following: Unlike in Comparative Production Examples P0 and P6, the green phosphor 13 in accordance with each of Production Examples P1 to P5 and P7 had (i) an emission-spectrum half width of not less than 35 nm and not more than 50 nm, (ii) an emission-spectrum peak wavelength of not less than 518 nm and not more than 528 nm, (iii) an x chromaticity coordinate CIEx of not less than 0.180 and not more than 0.260, and (iv) a Mn concentration of not less than 1.5 wt % and not more than 4.5 wt %.

Using the green phosphor 13 in accordance with any of Production Examples P1 to P5 and P7 therefore allows for production of an image display apparatus that has a larger Adobe RGB color gamut coverage or a larger NTSC color gamut coverage and a higher luminous efficiency than conventional image display apparatuses.

Further, the green phosphor 13 in accordance with each of Production Examples P1 to P5 and P7 had an emission-spectrum half width larger than that for Comparative Production Example P0. The green phosphor 13 in accordance with each of Production Examples P1 to P5 and P7, as a result, had an excitation spectrum whose half width of a peak wavelength at or around 445 nm was in a range of 23 nm to 25.5 nm, which is larger than that for Comparative Production Example P0. Using the green phosphor 13 in accordance with any of Production Examples P1 to P5 and P7 therefore allows for production of an image display apparatus having improved color stability.

(Preparation of Red Phosphor)

The following description will discuss the red phosphor 12 with reference to FIG. 5. FIG. 5 is a graph that shows an emission spectrum and an excitation spectrum of a red phosphor 12 in accordance with Production Example R1. In Production Example R1, a $Mn^{4+}$-activated $K_2SiF_6$ phosphor was prepared as the red phosphor 12.

Production Example R1: Preparation of $Mn^{4+}$-Activated $K_2SiF_6$ Phosphor

The procedure below was carried out to prepare a $Mn^{4+}$-activated fluorine complex phosphor represented by the above-described composition formula (A): $MI_2(MII_{1-h}Mn_h)F_6$, where MI is K, MII is Si, and h=0.06.

First, a fluorine resin-based ion-exchange membrane as a divider (diaphragm) was placed at the center of a reaction vessel made of a vinyl chloride resin. An anode and a cathode each made of a platinum plate were placed in two respective compartments separated by the ion-exchange membrane. A hydrofluoric acid aqueous solution containing manganese(II) fluoride dissolved therein was put in the compartment on the anode side of the reaction vessel, whereas a hydrofluoric acid aqueous solution was put in the compartment on the cathode side of the reaction vessel.

The anode and the cathode were connected to a power source. Electrolysis was then performed at a voltage of 3 V and a current of 0.75 A. After the electrolysis ended, an excess of a hydrofluoric acid aqueous solution saturated with potassium fluoride was added to a resulting reaction solution on the anode side, so that $K_2MnF_6$ was produced as a yellow solid product. The yellow solid product produced was then filtered out for recovery to give $K_2MnF_6$.

Next, 4.8 g of silicon dioxide was dissolved in 100 cm$^3$ of a 48 mass % hydrofluoric acid aqueous solution to give a silicon fluoride-containing aqueous solution. This aqueous solution was left to cool down to room temperature, then put into a lidded resin vessel, and heated in a water bath having a temperature kept at 70° C. for not shorter than 1 hour. To this silicon fluoride-containing aqueous solution, 1.19 g of $K_2MnF_6$ powder prepared above was added. Then, stirring was performed so as to dissolve the $K_2MnF_6$ powder in the silicon fluoride-containing aqueous solution, so that an aqueous solution (first solution) containing silicon fluoride and $K_2MnF_6$ was prepared.

Next, 13.95 g of potassium fluoride was dissolved in 40 cm$^3$ of a 48 mass % hydrofluoric acid aqueous solution. This mixture was left to cool down to room temperature, so that an aqueous solution (second solution) containing potassium fluoride was prepared.

After that, the second solution was added, little by little over a period of approximately 2.5 minutes, to the first solution having been stirred. The mixture was then stirred for approximately 10 minutes, so that a light-orange-colored solid was produced. This solid product was filtered out, and was washed with a small amount of a 20 mass % hydrofluoric acid aqueous solution. After that, the solid product was washed further with ethanol, and was vacuum-dried. As a result, the $Mn^{4+}$-activated $K_2SiF_6$ phosphor powder in accordance with Production Example R1 was prepared.

The phosphor powder prepared was subjected to powder X ray diffraction (XRD) involving use of a Kα ray of Cu. The charts obtained as the results of the XRD of the phosphor powder all indicated that the phosphor powder had a $K_2SiF_6$ structure. Further, the phosphor powder was irradiated with light having a wavelength of 365 nm. This confirmed that the phosphor powder would emit red light in response to such irradiation.

Next, the above-prepared red phosphor 12 in accordance with Comparative Production Example R1 was irradiated with light having a wavelength of 445 nm, so that an emission spectrum shown in FIG. 5 was obtained. Specifically, this emission spectrum was measured by irradiating the red phosphor 12 with light having a wavelength of 445 nm and thereby exciting the red phosphor 12, with use of a spectrophotometer (MCPD-7000, produced by Otsuka Electronics Co., Ltd.). The excitation spectrum was obtained by monitoring the peak wavelength of the emission spectrum.

FIG. 5 shows that the red phosphor 12 in accordance with Production Example R1 had an emission spectrum with a wavelength well-matched with a red color filter 126r of FIG. 10. The emission spectrum shown in FIG. 5 was analyzed, the result of which showed that the red phosphor 12 in accordance with Production Example R1 had an emission spectrum with a peak wavelength of 630 nm and a half width of 8 nm. The emission spectrum was further referred to for calculation of chromaticity coordinates, which were (CIEx, CIEy)=(0.691, 0.307) on the CIE1931 chromaticity coordinates.

Examples and Comparative Examples of Light Emitting Device

The following description will discuss Examples for the light emitting device 10 and their Comparative Examples with reference to FIGS. 7 and 8. (a) of FIG. 7 is a graph that shows an emission spectrum of a light emitting device in accordance with Comparative Example D0. (g) of FIG. 7 is a graph that shows an emission spectrum of a light emitting device in accordance with Comparative Example D6. (b) through (f) and (h) of FIG. 7 are each a graph that shows an emission spectrum of a light emitting device 10 in accordance with a corresponding one of Examples D1 to D5 and D7. Specifically, (b) of FIG. 7 corresponds to Example D1. (c) of FIG. 7 corresponds to Example D2. (d) of FIG. 7 corresponds to Example D3. (e) of FIG. 7 corresponds to Example D4. (f) of FIG. 7 corresponds to Example D5. (h) of FIG. 7 corresponds to Example D7. The graphs of FIG. 7 each have a vertical axis representing an emission intensity (arbitrary unit) and a horizontal axis representing a wavelength (nm). FIG. 8 is a table that shows, for each of the respective light emitting devices 10 in accordance with Examples D1 to D5 and D7 and Comparative Examples D0 and D6, (i) a mixing ratio of a green phosphor to a red phosphor both dispersed in a dispersion medium (resin) and (ii) a mixing ratio of the dispersion medium to the combination of the red phosphor and the green phosphor.

Comparative Example D0

With reference to (a) of FIG. 7 and FIG. 8, the following description will first discuss a Production Example (Comparative Example D0) for a light emitting device to be compared with the light emitting device 10 in accordance with Embodiment 1.

The light emitting device in accordance with Comparative Example D0 has a structure similar to the structure of the light emitting device 10 illustrated in FIG. 1. The light emitting device in accordance with Comparative Example D0 includes (i) as a light emitting element, a blue LED (produced by Cree Inc.) having an emission peak wavelength of 445 nm, (ii) as a red phosphor, the $Mn^{4+}$-activated $K_2SiF_6$ phosphor prepared in Production Example R1 above, (iii) as a green phosphor, the $Mn^{2+}$-activated γ-AlON phosphor prepared in Comparative Production Example P0 above, and (iv) as a dispersion medium, a silicone resin (KER-2500, produced by Shin-Etsu Chemical Co., Ltd.).

First, the $Mn^{4+}$-activated $K_2SiF_6$ phosphor of Production Example R1 above and the $Mn^{2+}$-activated γ-AlON phosphor of Comparative Production Example P0 above were mixed at the weight ratio of 1:38 so as to give a phosphor mixture, which is to be dispersed in the silicone resin.

Next, the phosphor mixture was dispersed in the silicone resin, so that a phosphor-dispersed resin was prepared. Specifically, the phosphor-dispersed resin was prepared by mixing the phosphor mixture and the silicone resin at the weight ratio of 1:0.5.

After that, the light emitting device produced was driven with a drive current of 20 mA to emit light, of which the emission spectrum was measured with use of a spectrophotometer (MCPD-7000, produced by Otsuka Electronics Co., Ltd.). (a) of FIG. 7 shows the emission spectrum thus obtained. In Comparative Example D0, the $Mn^{4+}$-activated $K_2SiF_6$ phosphor and the $Mn^{2+}$-activated γ-AlON phosphor were dispersed in respective amounts adjusted such that in a case where light with the emission spectrum shown in (a) of FIG. 7 passed through a liquid crystal panel including color filters having respective transmission spectra shown in FIG. 10, the white point would define white at or around 10,000 K. The color filters will be described later.

Comparative Example D6

With reference to (g) of FIG. 7 and FIG. 8, the following description will now discuss another Production Example (Comparative Example D6) for a light emitting device to be compared with the light emitting device 10 in accordance with Embodiment 1.

The light emitting device in accordance with Comparative Example D6 has a structure similar to the structure of the light emitting device 10 illustrated in FIG. 1. The light emitting device in accordance with Comparative Example D6 includes (i) as a light emitting element, a blue LED (produced by Cree Inc.) having an emission peak wavelength of 445 nm, (ii) as a red phosphor, the $Mn^{4+}$-activated $K_2SiF_6$ phosphor prepared in Production Example R1 above, (iii) as a green phosphor, the $Mn^{2+}$-activated γ-AlON phosphor prepared in Comparative Production Example P6 above, and (iv) as a dispersion medium, a silicone resin (KER-2500, produced by Shin-Etsu Chemical Co., Ltd.).

For the light emitting device in accordance with Comparative Example D6, the $Mn^{4+}$-activated $K_2SiF_6$ phosphor of Production Example R1 above and the $Mn^{2+}$-activated γ-AlON phosphor of Comparative Production Example P6 above were mixed at the weight ratio of 1:20.5 so as to give a phosphor mixture, which is to be dispersed in the silicone resin.

Next, the phosphor mixture was dispersed in the silicone resin, so that a phosphor-dispersed resin was prepared. Specifically, the phosphor-dispersed resin was prepared by mixing the phosphor mixture and the silicone resin at the weight ratio of 1:0.80.

After that, the emission spectrum of the light emitting device in accordance with Comparative Example D6 was measured similarly to the emission spectrum of the light emitting device in accordance with Comparative Example D0. (g) of FIG. 7 shows the emission spectrum thus obtained. In Comparative Example D6 as well, the $Mn^{4+}$-activated $K_2SiF_6$ phosphor and the $Mn^{2+}$-activated γ-AlON phosphor were dispersed in respective amounts adjusted as in Comparative Example D0.

Examples D1 to D5 and D7

The following description will now discuss Production Examples (Examples D1 to D5 and D7) for the light emitting device 10 in accordance with Embodiment 1 with reference to (b) through (f) and (h) of FIG. 7 and FIG. 8.

The light emitting device 10 in accordance with each of Examples D1 to D5 and D7 has the structure illustrated in FIG. 1. The light emitting device 10 in accordance with each of Examples D1 to D5 and D7 includes (i) as a light emitting element 11, a blue LED (produced by Cree Inc.) having an emission peak wavelength of 445 nm, (ii) as a red phosphor 12, the $Mn^{4+}$-activated $K_2SiF_6$ phosphor prepared in Production Example R1 above, (iii) as a green phosphor 13, the $Mn^{2+}$-activated γ-AlON phosphor prepared in a corresponding one of Production Examples P1 to P5 and P7 above, and (iv) as a dispersion medium 16, a silicone resin (KER-2500, produced by Shin-Etsu Chemical Co., Ltd.).

As in Comparative Example D0, the $Mn^{4+}$-activated $K_2SiF_6$ phosphor of Production Example R1 above and the $Mn^{2+}$-activated γ-AlON phosphor of each of Production Examples P1 to P5 and P7 above were mixed at a corresponding weight ratio shown in FIG. 8 so as to give a phosphor mixture, which is to be dispersed in the silicone resin.

FIG. 8 shows weight ratios of the green phosphor 13 to the red phosphor 12. In Example D1, for example, the $Mn^{4+}$-activated $K_2SiF_6$ phosphor in accordance with Production Example R1 and the $Mn^{2+}$-activated γ-AlON phosphor in accordance with Production Example P1 were mixed at the weight ratio of 1:27.8.

Next, each phosphor mixture was dispersed in the silicone resin, so that a phosphor-dispersed resin was prepared. Specifically, the phosphor-dispersed resin was prepared by mixing each phosphor mixture and the silicone resin at a corresponding weight ratio shown in FIG. 8.

FIG. 8 shows weight ratios of the silicone resin to the combination of the red phosphor 12 and the green phosphor 13. In Example D1, for example, (i) the combination of the $Mn^{4+}$-activated $K_2SiF_6$ phosphor in accordance with Production Example R1 and the $Mn^{2+}$-activated γ-AlON phosphor in accordance with Production Example P1 and (ii) the silicone resin were mixed at the weight ratio of 1:0.54.

After that, each light emitting device produced was driven with a drive current of 20 mA to emit light, of which the emission spectrum was measured with use of a spectrophotometer (MCPD-7000, produced by Otsuka Electronics Co., Ltd.). (b) through (f) and (h) of FIG. 7 show the emission spectra thus obtained. In each of Examples D1 to D5 and D7 as well as Comparative Example D0, the $Mn^{4+}$-activated $K_2SiF_6$ phosphor and the $Mn^{2+}$-activated γ-AlON phosphor were dispersed in respective amounts adjusted such that in a case where light with the emission spectrum shown in a corresponding one of (b) through (f) and (h) of FIG. 7 passed through a liquid crystal panel including color filters having respective transmission spectra shown in FIG. 10, the white point would define white at or around 10,000 K. The color filters will be described later.

Each light emitting device 10 produced as described above can be used as a backlight device for an image display apparatus, so that an image display apparatus having a high luminous efficiency and a wide color reproduction range can be provided. Such an image display apparatus will be described in Embodiment 2 in detail.

Embodiment 2

The following description will discuss Embodiment 2 with reference to FIGS. 9 through 12. Embodiment 2 described here is an image display apparatus 100 including the light emitting device 10 in accordance with Embodiment 1. Note that for convenience of description, any member having a function identical to that of a member discussed in the foregoing embodiment will be given an identical reference sign, and a description thereof will be omitted.

(Image Display Apparatus 100)

(a) of FIG. 9 is an exploded perspective view of the image display apparatus 100, which is an example of an image display apparatus in accordance with Embodiment 2. (b) of FIG. 9 is an exploded perspective view of a liquid crystal display device 120a of the image display apparatus 100 illustrated in (a) of FIG. 9. FIG. 10 is a graph that shows a transmission spectrum of a color filter of the above image display apparatus 100.

As illustrated in (a) of FIG. 9, the image display apparatus 100 includes the light emitting device 10, a light guide plate 110, and a liquid crystal display section 120. The light guide plate 110 is transparent or translucent. The liquid crystal display section 120 is a section which displays an image, and includes a plurality of liquid crystal display devices 120a.

The image display apparatus 100 includes a plurality of light emitting devices 10 provided on a side surface of the light guide member 110. As illustrated in (a) of FIG. 9, Embodiment 2 includes six light emitting devices 10. The liquid crystal display section 120 composed of the plurality of liquid crystal display devices 120a is provided so as to be adjacent to the light guide plate 110. Light 130 having exited from the light emitting device 10 is scattered in the light guide plate 110 so as to be scattered light 140. Then, an entire surface of the liquid crystal display section 120 is irradiated with the scattered light 140.

(Liquid Crystal Display Device 120a)

As illustrated in (b) of FIG. 9, each of the liquid crystal display devices 120a that constitute the liquid crystal display section 120 includes a polarizing plate 121, a transparent conductive film 123a (including thin film transistors 122), an alignment film 124a, a liquid crystal layer 125, an alignment film 124b, an upper thin film electrode 123b, a color filter 126 for display of color pixels, and an upper polarizing plate 127, which are stacked in this order.

The color filter 126 is divided into portions that correspond in size to respective pixels of the transparent conductive film 123a. The color filter 126 includes a red color filter 126r that transmits red light, a green color filter 126g that transmits green light, and a blue color filter 126b that transmits blue light.

The image display apparatus 100 in accordance with Embodiment 2 preferably includes filters that transmit red light, green light, and blue light, respectively, as in the color filter 126 illustrated in (b) of FIG. 9. In such a case, it is possible to suitably use, for respective colors, color filters that exhibit, for example, respective transmission spectra shown in FIG. 10. Note that Examples described later includes color filters having the spectra shown in FIG. 10, respectively.

The green color filter 126g of Embodiment 2 has a higher transmittance than a green color filter typically used in wide-color-gamut liquid crystal displays. More specifically, the green color filter 126g has a transmittance of not less than 80% for light in a wavelength range of not less than 520 nm and not more than 540 nm.

Typically, a green color filter having a high transmittance as above deteriorates green color reproducibility. However, since the $Mn^{2+}$-activated γ-AlON phosphor is used as the green phosphor 13 in the light emitting device 10 of the image display apparatus 100 of Embodiment 2, the image display apparatus 100 can have a wide color reproduction range even in a case where a green color filter having a high transmittance is used as the green color filter 126g. Further, since the green color filter 126g can be a green color filter having a high transmittance, the image display apparatus 100 can have an improved luminance. That is, in the image display apparatus 100, it is possible to achieve both a high brightness of an image displayed on the image display device 100 and a wide color reproduction range.

Examples and Comparative Examples of Image Display Apparatus

The following description will discuss Examples and Comparative Examples of the image display apparatus 100 with reference to FIGS. 11 and 12. FIG. 11 is a table that shows (i) coverages, area ratios, and chromaticity points of each of image display apparatuses 100 in accordance with Examples DIS1 to DIS5 and DIS1 of Embodiment 2, and (ii) coverages, area ratios, and chromaticity points of each of image display apparatuses of Comparative Examples DIS0 and DIS6 of Embodiment 2. FIG. 12 provides graphs each for comparing, with the NTSC color gamut and the Adobe RGB color gamut, each of (i) color gamuts of the image display apparatuses 100 in accordance with Examples DIS1 to DIS5 and DIS1 of Embodiment 2 and (ii) color gamuts of the image display apparatuses of Comparative Examples DIS0 and DIS6 of Embodiment 2.

Comparative Examples DIS0 and DIS6

The image display apparatuses in accordance with Comparative Examples DIS0 and DIS6 each have a structure similar to the structure of the image display apparatus 100 illustrated in FIG. 9. The light emitting device of Comparative Example D0 was used as a backlight device for the image display apparatus in accordance with Comparative Example DIS0. The light emitting device of Comparative Example D6 was used as a backlight device for the image display apparatus in accordance with Comparative Example DIS6. Meanwhile, the image display apparatuses in accordance with Comparative Examples DIS0 and DIS6 each were provided with a color filter having a transmittance shown in FIG. 10. Specifically, the image display apparatuses in accordance with Comparative Examples DIS0 and DIS6 each were provided with the color filter 126 including the red color filter 126r, the green color filter 126g, and the blue color filter 126b.

Examples DIS1 to DIS5 and DIS7

The image display apparatuses 100 in accordance with Examples DIS1 to DIS5 and DIS7 each have the structure illustrated in FIG. 9. The light emitting devices 10 of Examples D1 through D5 and D7 were used as respective backlight devices for Examples DIS1 to DIS5 and DIS7. Further, the color filter 126 having the transmittance illustrated in FIG. 10 was used as a color filter for each of Examples DIS1 to DIS5 and DIS7.
(Comparison of Color Reproduction Ranges of Image Display Apparatuses)

FIG. 11 shows, for each of the image display apparatuses of Examples and Comparative Examples, (i) chromaticity coordinates of each of a white point, a red point, a green point, and a blue point on the CIE1931 chromaticity coordinates of display light on screen, (ii) an NTSC color gamut coverage and an NTSC color gamut area ratio, and (iii) an Adobe RGB color gamut coverage and an Adobe RGB color gamut area ratio.

The "red point", the "green point", and the "blue point" as used herein mean respective chromaticity points of a display in a case where the display performs display (on screen) of only light having passed through a red color filter, a green color filter, and a blue color filter, respectively. The "white point" as used herein means a chromaticity point on the display in a case where the display simultaneously performs display of all light passing through the above color filters. The "NTSC color gamut coverage" as used herein means a ratio of an area covered within an area of the NTSC color gamut by a color gamut defined by a triangle obtained by lines connecting the red point, the green point, and the blue point, with respect to an entire area of the NTSC color gamut. The "NTSC color gamut area ratio" as used herein means a ratio of the area of the color gamut defined by the triangle obtained by lines connecting the red point, the green point, and the blue point, with respect to the entire area of the NTSC color gamut. Similarly, the "Adobe RGB color gamut coverage" as used herein means a ratio of an area covered within an area of the Adobe color gamut by the color gamut defined by the triangle obtained by lines connecting the red point, the green point, and the blue point, with respect to an entire area of the Adobe RGB color gamut. The "Adobe RGB area ratio" as used herein means a ratio of the area of the color gamut defined by the triangle obtained by lines connecting the red point, the green point, and the blue point, with respect to the entire area of the Adobe RGB color gamut.

Note that each of the chromaticity points, the NTSC color gamut coverage, the NTSC color gamut area ratio, the Adobe RGB color gamut coverage, and the Adobe RGB color gamut area ratio was calculated from spectrum data measured with use of MCPD-7000 produced by Otsuka Electronics Co., Ltd.

It is clear from parameters, shown in FIG. 11, of each of Examples DIS1 to DIS5 and DIS7 and Comparative Example DIS0 that the NTSC color gamut area ratio and the Adobe RGB color gamut area ratio of each of the image display apparatuses 100 of Examples DIS1 to DIS5 and DIS7 are lower than those of the image display apparatus of Comparative Example DIS0. Meanwhile, it is also clear from the above parameters that the NTSC color gamut coverage and the Adobe RGB color gamut coverage of each of the image display apparatuses 100 of Examples DIS1 to DIS5 and DIS7 are larger than those of the image display apparatus of Comparative Example DIS0.

The above effect will be discussed below with reference to (a) through (f) and (h) of FIG. 12. (a) of FIG. 12 is a graph for comparing the color gamut of the image display device of Comparative Example DIS0 with the NTSC color gamut and the Adobe RGB color gamut. (b) through (f) and (h) of FIG. 12 are each a graph for comparing, with the NTSC color gamut and the Adobe RGB color gamut, the color gamut of each of the image display apparatuses of Examples DIS1 to DIS5 and DIS7.

In each of (a) through (f) and (h) of FIG. 12, an area for green of each color gamut is in the vicinity of (CIEx, CIEy)=(0.2, 0.7). A comparison between (a) of FIG. 12 and (b) through (f) and (h) of FIG. 12 shows that the color gamut of each of the image display apparatuses 100 of Examples DIS1 to DIS5 and DIS7 has an area for green that is better matched with respective areas for green of the NTSC color gamut and the Adobe RGB color gamut, than an area for green of the color gamut of the image display apparatus of Comparative Example DIS0. More specifically, the image display apparatus of Comparative Example DIS0 has a color gamut whose green point is positioned too much to the left on (a) of FIG. 12, i.e., whose green point has a too small CIEx coordinate value, and the green point is located largely off the NTSC color gamut and the Adobe color gamut (see (a) of FIG. 12). Accordingly, though the color gamut of the image display apparatus of Comparative Example DIS0 has a large area, the image display apparatus of Comparative Example DIS0 has a low NTSC color gamut coverage and a low Adobe RGB color gamut coverage.

(a) through (f) and (h) of FIG. 12 also show that the color gamut of each of the image display apparatuses 100 of Examples DIS1 to DIS5 and DIS7 has an area for blue that is better matched with respective areas for blue of the NTSC color gamut and the Adobe RGB color gamut, than an area for blue of the color gamut of the image display apparatus of Comparative Example DIS0.

It is also clear from parameters, shown in FIG. 11, of each of Examples DIS1 to DIS5 and DIS7 and Comparative Example DIS6 that the NTSC color gamut area ratio and the Adobe RGB color gamut area ratio of each of the image display apparatuses 100 of Examples DIS1 to DIS5 and DIS7 are larger than those of the image display apparatus of Comparative Example DIS6. Meanwhile, it is also clear from the above parameters that the NTSC color gamut coverage and the Adobe RGB color gamut coverage of each of the image display apparatuses 100 of Examples DIS1 to DIS5 and DIS7 are larger than those of the image display apparatus of Comparative Example DIS6.

The above effect will be discussed below with reference to (b) to (h) of FIG. 12. (g) of FIG. 12 is a graph for comparing the color gamut of the image display apparatus of Comparative Example DIS6 with the NTSC color gamut and the Adobe RGB color gamut.

(b) through (h) of FIG. 12 show that the color gamut of each of the image display apparatuses 100 of Examples DIS1 to DIS5 and DIS1 has an area for green that is better matched with the respective areas for green of the NTSC color gamut and the Adobe RGB color gamut, than an area for green of the color gamut of the image display apparatus of Comparative Example DIS6. More specifically, the image display apparatus of Comparative Example DIS6 has a color gamut whose green point is not located largely off those of the NTSC color gamut and the Adobe RGB color gamut, but the green point is positioned too much to the lower right on (g) of FIG. 12, i.e., the green point has a too large CIEx coordinate value and a too small CIEy coordinate value. It follows that the color gamut of the image display apparatus of Comparative Example DIS6 has a small area, a low NTSC color gamut coverage, and a low Adobe RGB color gamut coverage.

It is therefore clear that the image display apparatuses of Examples DIS1 to DIS5 and DIS1 are more useful for practical use than the image display apparatuses of Comparative Examples DIS0 and DIS6.

The above results of the comparison are attributed to appropriately set emission-spectrum peak wavelength and emission-spectrum half width of the $Mn^{2+}$-activated γ-AlON phosphor used as the green phosphor 13 in one aspect of the present invention, in a configuration in which the $Mn^{2+}$-activated γ-AlON phosphor is used in combination with the $Mn^{4+}$-activated phosphor. Further, the above results are also attributed to an appropriately set Mn concentration of the $Mn^{2+}$-activated γ-AlON phosphor used in one aspect of the present invention in the configuration in which the $Mn^{2+}$-activated γ-AlON phosphor is used in combination with the $Mn^{4+}$-activated phosphor.

Note that though Patent Literature 2 discusses only an NTSC color gamut area ratio of an image display apparatus, improvement in gamut coverage such as the NTSC color gamut coverage and the Adobe RGB color gamut coverage is important for actual improvement of a color reproduction range of an image display apparatus. More specifically, Patent Literature 2 discloses a configuration that improves the NTSC color gamut area ratio, but does not discuss the NTSC color gamut coverage, which is in practice more important than the NTSC color gamut area ratio. Further, in the configuration of Patent Literature 2, an actual NTSC color gamut coverage is not sufficiently large. It follows that, in a case where the image display apparatus of Patent Literature 2 is used as a display apparatus in conformity with a standard such as the NTSC standard and the Adobe RGB standard, a color gamut of colors that the display apparatus can actually display may become smaller.

The image display apparatus 100 of Embodiment 2 includes the light emitting device 10 of Embodiment 1. That is, as described in Embodiment 1, the image display apparatus 100 of Embodiment 2 uses, as the green phosphor 13 which serves as a wavelength conversion member of the light emitting device 10, the $Mn^{2+}$-activated γ-AlON phosphor whose emission-spectrum peak wavelength, emission-spectrum half width, and Mn concentration in a phosphor crystal are controlled. Further, the image display apparatus 100 of Embodiment 2 uses the above green phosphor 13 in combination with the $Mn^{4+}$-activated phosphor which is used as the red phosphor 12.

Therefore, it is possible to provide an image display apparatus 100 having a large NTSC color gamut coverage, a large Adobe RGB color gamut coverage, and a high luminous efficiency.

Embodiment 3

The following description will discuss Embodiment 3 with reference to FIG. 13. Embodiment 3 will discuss a light emitting device 10a in accordance with another embodiment of the light emitting device 10 discussed in Embodiment 1. Note that for convenience of description, any member having a function identical to that of a member discussed in the foregoing embodiments will be given an identical reference sign, and a description thereof will be omitted.

(Light Emitting Device 10a)

As illustrated in FIG. 13, the light emitting device 10a includes a light emitting element 11, a red phosphor 12, a green phosphor 13, a printed wiring board 14, a resin frame 15, a dispersion medium 16, and a light scattering material (scattering material) 17. That is, the light emitting device 10a of Embodiment 3 differs from the light emitting device 10 of Embodiment 1 in that the light emitting device 10a further includes the light scattering material 17.

(Light Scattering Material 17)

The light scattering material 17 scatters blue light emitted by the light emitting element 11. The light scattering material 17 is uniformly dispersed in the dispersion medium together with the red phosphor 12 and the green phosphor 13. As the light scattering material 17, for example, metallic oxides such as $SiO_2$, $Al_2O_3$, $Y_2O_3$, $Zr_2O_3$, $TiO_2$, and the like can be suitably used. Among such metallic oxides, $Al_2O_3$ or $Y_2O_3$ can be more suitably used as the light scattering material 17, because $Al_2O_3$ and $Y_2O_3$ are high in refraction index and low in visual light absorbance.

The light scattering material 17 of Embodiment 3 has a particle diameter of not less than 50 nm and not more than 5 μm. In a case where the light scattering material 17 has a particle diameter outside the above range, scattering efficiency for blue light may decrease. Thus, the light scattering material 17 can suitably have a particle diameter within the above range.

As described above, the light emitting device 10a of Embodiment 3 includes the light scattering material 17 and this makes it possible to efficiently scatter blue light (excitation light) emitted by the light emitting element 11. That is, the light emitting device 10a allows the red phosphor 12 and the green phosphor 13 to be more efficiently irradiated with the blue light. This reduces an amount (i.e., weight) of the red phosphor 12 and the green phosphor 13 used in the light emitting device 10a. This can in turn reduce the weight of the light emitting device 10a, and ultimately makes it possible to reduce the weight of an image display apparatus that includes the above light emitting device 10a.

The light emitting device 10 of Embodiment 1 and the light emitting device 10a in accordance with Embodiment 3 each use (i) a $Mn^{2+}$-activated γ-AlON phosphor as the green phosphor 13 and (ii) a $Mn^{4+}$-activated phosphor as the red phosphor 12. That is, the light emitting devices 10 and 10a each use, as a light emitting element, Mn of an indirect transition type. This decreases the probability of transition in light absorption in each of the red phosphor 12 and the green phosphor 13. In order to improve the luminous efficiency, it is necessary to increase an amount of the red phosphor 12 and the green phosphor 13 dispersed in the dispersion medium 16 so that the probability of transition will be improved.

Since the light emitting device 10a includes the light scattering material 17 dispersed in the dispersion medium 16, it is possible to reduce the amounts of the red phosphor 12 and the green phosphor 13. This makes it possible to prevent an increase in amounts of the red phosphor 12 and the green phosphor 13 even in a case where the probability of transition decreases. That is, the light scattering material 17 has an important role in a light emitting device in which the $Mn^{2+}$-activated γ-AlON phosphor and the $Mn^{4+}$-activated phosphor are used in combination.

Embodiment 4

The following description will discuss Embodiment 4. Embodiment 4 is another embodiment of the light emitting device described in Embodiment 1. A light emitting device in accordance with Embodiment 4 is similar in configuration to the light emitting device 10 except for a light emitting element 11, and descriptions of members, except for the light emitting element 11, of the light emitting device will be omitted.

In the light emitting device in accordance with Embodiment 4, a light emitting element emits primary light (excitation light) having a peak wavelength of not less than 420 nm and not more than 440 nm. Embodiment 4 can provide a light emitting device that makes it possible to provide an image display apparatus having a wide color reproduction range even in a case where Embodiment 4 uses a light emitting element that emits primary light (excitation light) having such a peak wavelength.

Note however that the light emitting device 10 of Embodiment 1 is higher in luminous efficiency than the light emitting device of Embodiment 4, because the light emitting device 10 of Embodiment 1 emits primary light (excitation light) having a peak wavelength well-matched with an excitation spectrum of the red phosphor 12 and with a transmission spectrum of the blue color filter 126b.

(Relation Between Peak Wavelength of Primary Light and Luminous Efficiency)

The following description will discuss a relation between the peak wavelength of the primary light and the luminous efficiency with reference to FIG. 14. FIG. 14 is a table that shows, for each of light emitting devices 10 in accordance with Examples D8 and D9 of Embodiment 4, (i) a mixing ratio of a green phosphor 13 to a red phosphor 12 both dispersed in a dispersion medium 16, (ii) a mixing ratio of the dispersion medium 16 to the combination of the green phosphor 13 and the red phosphor 12, and (iii) a luminous efficiency. Note that for comparison of luminous efficiencies, FIG. 14 also shows data of the light emitting device 10 in accordance with Example D5 of Embodiment 1. The luminous efficiency in FIG. 14 indicates a luminous flux value (relative value) of each of the light emitting devices 10 in accordance with respective Examples relative to that of the light emitting device 10 of Example D5, on the assumption that a luminous flux value (luminous efficiency) of the light emitting device 10 of Example D5 is 100.

As shown in FIG. 14, in Example D8 of Embodiment 4, primary light (excitation light) emitted by the light emitting element 11 has a peak wavelength of 430 nm. Meanwhile, in Example D9 of Embodiment 4, primary light emitted by the light emitting element 11 has a peak wavelength of 440 nm. As with Example D5, each of Examples D8 and D9 of Embodiment 4 uses the green phosphor 13 produced in Production Example P5. Further, in each of Examples D8 and D9 of Embodiment 4, the red phosphor 12 and the green phosphor 13 are dispersed in the dispersion medium 16 so as to meet the mixing ratios shown in FIG. 14. Furthermore, as with Examples D1 to D5 and D7, in each of Examples D8 and D9, respective amounts of the red phosphor 12, the green phosphor 13, and the dispersion medium 16 mixed with one another are adjusted such that in a case where light emitted by the light emitting device has passed through a liquid crystal panel including color filters having respective transmission spectra shown in FIG. 10, a chromaticity point indicative of a white point will be in the vicinity of (CIEx, CIEy)=(0.281, 0.288) and will also define white at a color temperature of 10,000 K.

As shown in FIG. 14, the luminous efficiency of Example D8 (peak wavelength of light emitting element 11: 430 nm) is 81 relative to that of Example D5, on the assumption that the luminous efficiency of Example D5 (peak wavelength of light emitting element 11: 445 nm) is 100. As such, the luminous efficiency of Example D8 is lower than that of Example D5. However, the level of the luminous efficiency of Example D8 is still sufficient to achieve an intended luminous efficiency that can be achieved by the image display apparatus according to one aspect of the present invention.

The luminous efficiency of Example D9 (peak wavelength of light emitting element 11: 440 nm) is 96 relative to that of Example D5, on the assumption that the luminous efficiency in Example D5 is 100. As such, Example D9 has achieved a luminous efficiency substantially equal to that of Example D5.

As is clear from FIG. 14, it is possible to achieve an intended luminous efficiency in a case where primary light emitted by the light emitting element 11 has a peak wavelength of not less than 420 nm and not more than 440 nm. Therefore, it is possible to suitably use the light emitting device 10 of Embodiment 4 in the image display apparatus according to one aspect of the present invention.

Embodiment 5

The following description will discuss Embodiment 5 with reference to FIGS. 15 through 18. Embodiment 5 will discuss an image display apparatus 200 including a light emitting device 10. Note that for convenience of description, any member having a function identical to that of a member discussed in the foregoing embodiments will be given an identical reference sign, and a description thereof will be omitted.

(Image Display Apparatus 200)

(a) of FIG. 15 is an exploded perspective view of the image display apparatus 200, which is an example of an image display apparatus in accordance with Embodiment 5.

(b) of FIG. 15 is an exploded perspective view of a liquid crystal display device 120b of the image display apparatus 200 illustrated in (a) of FIG. 15. FIG. 16 is a graph that shows a transmission spectrum of a color filter 126' of the image display apparatus 200.

As illustrated in FIG. 15, the image display apparatus 200 of Embodiment 5 differs from the image display apparatus 100 of Embodiment 2 in that the image display apparatus 200 includes a liquid crystal display device 120b. Specifically, the image display apparatus 200 differs from the image display apparatus 100 in that the image display apparatus 200 includes a color filter 126' that includes a red color filter 126r, a green color filter 126g', and a blue color filter 126b'. That is, in order to provide an image display apparatus that corresponds to a color gamut wider than the NTSC color gamut and the Adobe RGB color gamut, the image display apparatus 200 includes, instead of the green color filter 126g and the blue color filter 126b of the image display apparatus 100, the green color filter 126g' and the blue color filter 126b'.

Specifically, in Embodiment 5, the green color filter 126g' is a green color filter having a transmittance of not more than 10% for light in a wavelength range of not less than 600 nm and not more than 680 nm and an transmission-spectrum half width of not more than 90 nm. Further, in Embodiment 5, it is possible to suitably use, as the green color filter 126g', a green color filter having a transmittance of not more than 10% for light in a wavelength range of not more than 470 nm.

Furthermore, in Embodiment 5, the blue color filter 126b' has a transmittance of not more than 10% for light in a wavelength range of not less than 520 nm and not more than 680 nm and a transmission-spectrum half width of not more than 100 nm.

FIG. 16 illustrates an example of a transmission spectrum of each of the green color filter 126g' and the blue color filter 126b' as described above. It is possible to employ a conventionally well-known method for producing color filters having respective properties similar to those of the green color filter 126g' and the blue color filter 126b'. For example, Patent Literature 4 discloses an example of such a production method.

(Example of Light Emitting Device)

The following description will discuss Example D10 of the light emitting device 10 in accordance with Embodiment 5 with reference to FIG. 17. FIG. 17 is a table that shows, for the light emitting device 10 in accordance with Example D10, (i) a mixing ratio of a green phosphor 13 to a red phosphor 12 both dispersed in a dispersion medium 16 and (ii) a mixing ratio of the dispersion medium 16 to the combination of the green phosphor 13 and the red phosphor 12.

The light emitting device 10 in accordance with Example D10 is produced as in the case of the light emitting device 10 in accordance with Example D4, except that (i) a weight ratio of the green phosphor 13 to the red phosphor 12 and (ii) a weight ratio of a silicone resin to a combination of the red phosphor 12 and the green phosphor 13 are set as shown in FIG. 17. Note that each weight ratio (amount of each of the red phosphor 12, the green phosphor 13, and the dispersion medium 16 mixed with one another) in Example D10 is adjusted such that in a case where light emitted by the light emitting device has passed through a liquid crystal panel including color filters having respective transmission spectra shown in FIG. 16, a chromaticity point indicative of a white point will define white at or around 10,000 K.

(Example of Image Display Apparatus)

The following description will discuss Example DIS10 of the image display apparatus 200 with reference to FIG. 18. FIG. 18 is a table that shows coverages, area ratios, and chromaticity coordinates of the image display apparatus 200 in accordance with Example DIS10 of Embodiment 5. For comparison, FIG. 18 also shows coverages etc. of the image display apparatus 100 in accordance with Example DIS5 of Embodiment 2.

The image display apparatus 200 in accordance with Example DIS10 has the structure illustrated in FIG. 15. The light emitting device 10 of Example D10 was used as a backlight device for the image display apparatus 200. The above image display apparatus 200 used, as a blue color filter and a green color filter, the blue color filter 126b' and the green color filter 126g' having corresponding transmittances shown in FIG. 16, respectively, and as a red color filter, the red color filter 126r having the corresponding transmittance shown in FIG. 10.

It is clear from FIG. 18, that the image display apparatus 200 in accordance with Example DIS10 has (i.e., maintains) an NTSC color gamut coverage and an Adobe RGB color gamut coverage substantially equal to those of the image display apparatus 100 in accordance with Example DIS5. The image display apparatus 200 in accordance with Example DIS10, however, has an NTSC color gamut area ratio and an Above RGB color gamut area ratio larger than those of the image display apparatus 100 in accordance with Example DIS5. That is, it is clear that the image display apparatus 200 can have a color reproduction range much wider than that of the image display apparatus 100 in accordance with Embodiment 2.

Therefore, the image display apparatus 200 of Embodiment 5 can be suitably used as an image display apparatus that corresponds to a next-generation color gamut, such as the BT. 2020 color gamut.

Embodiment 6

The following description will discuss Embodiment 6 with reference to FIG. 14. FIG. 14 is a table that shows, for a light emitting device 10 in accordance with Example D11 of Embodiment 6, (i) a mixing ratio of a green phosphor 13 to a red phosphor 12 both dispersed in a dispersion medium 16, (ii) a mixing ratio of the dispersion medium 16 to the combination of the green phosphor 13 and the red phosphor 12, and (iii) a luminous efficiency. The light emitting device in accordance with Embodiment 6 is similar in configuration to the light emitting device 10, except for a light emitting element 11, and descriptions of members, except for the light emitting element 11, of the light emitting device will be omitted.

In the light emitting device in accordance with Embodiment 6, a light emitting element emits primary light (excitation light) having a peak wavelength of not less than 440 nm and not more than 460 nm. Embodiment 6 can provide a light emitting device that makes it possible to provide an image display apparatus having a wide color reproduction range even in a case where Embodiment 6 uses a light emitting element that emits primary light (excitation light) having such a peak wavelength.

(Relation Between Peak Wavelength of Primary Light and Luminous Efficiency)

As shown in FIG. 14, in Example D11 of Embodiment 6, primary light (excitation light) emitted by the light emitting element 11 has a peak wavelength of 460 nm. As with Example D5, Example D11 of Embodiment 6 uses the green phosphor 13 produced in Production Example P5. Further, in Example D11 of Embodiment 6, the red phosphor 12 and the green phosphor 13 are dispersed in the dispersion medium so as to meet mixing ratios shown in FIG. 14. Furthermore, as with Examples D1 to D5 and D7, in Example 11 of Embodiment 6, respective amounts of the red phosphor 12, the green phosphor 13, and the dispersion medium 16 mixed with one another are adjusted such that in a case where light emitted by the light emitting device has passed through a liquid crystal panel including color filters having respective transmission spectra shown in FIG. 10, a chromaticity point indicative of a white point will be in the vicinity of (CIEx, CIEy)=(0.281, 0.288) and will also define white at a color temperature of 10,000 K.

As shown in FIG. 14, the luminous efficiency of Example D11 (peak wavelength of light emitting element 11: 460 nm) is 88 relative to that of Example D5, on the assumption that the luminous efficiency of Example D5 (peak wavelength of light emitting element 11: 445 nm) is 100. As such, the luminous efficiency of Example D11 is lower than that of Example D5. However, the level of the luminous efficiency of Example D11 is still sufficient to achieve an intended luminous efficiency that can be achieved by the image display apparatus according to one aspect of the present invention.

As described in Embodiment 4, the luminous efficiency of Example D9 (peak wavelength of light emitting element 11: 440 nm) is 96 relative to that of Example D5, on the assumption that the luminous efficiency of Example D5 is 100. As such, Example D9 has achieved a luminous efficiency substantially equal to that of Example D5.

As is clear from FIG. 14, it is possible to achieve an intended luminous efficiency in a case where primary light emitted by the light emitting element 11 has a peak wavelength of not less than 440 nm and not more than 460 nm. Therefore, it is possible to suitably use the light emitting device 10 of Embodiment 6 in the image display apparatus according to one aspect of the present invention.

[Overview]

A light emitting device (10, 10a) in accordance with Aspect 1 of the present invention includes: a light emitting element (11) that emits blue light; a $Mn^{2+}$-activated γ-AlON phosphor (green phosphor 13) that emits green light in response to excitation by the blue light; and a $Mn^{4+}$-activated phosphor (red phosphor 12) that emits red light in response to excitation by the blue light, the green light emitted by the $Mn^{2+}$-activated γ-AlON phosphor having an emission-spectrum peak wavelength of not less than 518 nm and not more than 528 nm.

In the above configuration, a wavelength conversion member is formed by combining the $Mn^{2+}$-activated γ-AlON phosphor, as a green phosphor, that emits green light in response to excitation by the blue light and the $Mn^{4+}$-activated phosphor, as a red phosphor, that emits red light in response to excitation by the blue light. The green light emitted by the $Mn^{2+}$-activated γ-AlON phosphor has an emission-spectrum peak wavelength of not less than 518 nm and not more than 528 nm.

In a case where the green light has an emission-spectrum peak wavelength of less than 518 nm or more than 528 nm in the light emitting device in which the $Mn^{2+}$-activated γ-AlON phosphor and the $Mn^{4+}$-activated phosphor are excited by the blue light, color reproducibility of an image display apparatus deteriorates, for example, an NTSC color gamut coverage and an Adobe RGB color gamut coverage deteriorate. In other words, in a case where the green light has an emission-spectrum peak wavelength of not less than 518 nm and not more than 528 nm, the NTSC color gamut coverage and the Adobe RGB color gamut coverage can be increased.

Therefore, the above light emitting device in accordance with Aspect 1 can advantageously provide an image display apparatus having a wide color reproduction range.

Moreover, in the above configuration, the green light emitted by the $Mn^{2+}$-activated γ-AlON phosphor has an emission-spectrum peak wavelength in the above wavelength range. Accordingly, an excitation spectrum of the $Mn^{2+}$-activated γ-AlON phosphor has a larger half-width of a peak wavelength at or around 445 nm. Then, even when a peak wavelength of the blue light varies, excitation efficiency of the phosphor does not easily change. The above light emitting device in accordance with Aspect 1 can therefore advantageously provide an image display apparatus having less variation in color reproduction range (less color variation).

A light emitting device in accordance with Aspect 2 of the present invention is preferably configured such that, in Aspect 1, the green light emitted by the $Mn^{2+}$-activated γ-AlON phosphor has an emission-spectrum half width of not less than 35 nm and not more than 50 nm.

In the above configuration, in a case where the emission-spectrum half width of the $Mn^{2+}$-activated γ-AlON phosphor is less than 35 nm or more than 50 nm, the emission-spectrum peak wavelength of the green light becomes less than 518 nm or more than 528 nm. This deteriorates an NTSC color gamut coverage and an Adobe RGB color gamut coverage. In other words, in a case where the green light has an emission-spectrum half width of not less than 35 nm and not more than 50 nm, the NTSC color gamut coverage and the Adobe RGB color gamut coverage can be increased.

Therefore, the above light emitting device in accordance with Aspect 2 can provide an image display apparatus having a wide color reproduction range.

A light emitting device in accordance with Aspect 3 of the present invention is configured preferably such that, in Aspect 1 or 2, the $Mn^{2+}$-activated γ-AlON phosphor has a Mn concentration of not less than 1.5 wt % and not more than 4.5 wt % in a crystal of the $Mn^{2+}$-activated γ-AlON phosphor.

In the above configuration, Mn is contained at a concentration of not less than 1.5 wt % and not more than 4.5 wt % in a crystal of the $Mn^{2+}$-activated γ-AlON phosphor. This can improve a blue light (excitation light) absorbance of the $Mn^{2+}$-activated γ-AlON phosphor. This allows the light emitting device in accordance with Aspect 3 to have an improved luminous efficiency.

A light emitting device (10, 10a) in accordance with Aspect 4 of the present invention includes: a light emitting element (11) that emits blue light; a $Mn^{2+}$-activated γ-AlON phosphor (green phosphor 13) that emits green light in response to excitation by the blue light; and a $Mn^{4+}$-activated phosphor (red phosphor 12) that emits red light in response to excitation by the blue light, the $Mn^{2+}$-activated γ-AlON phosphor having a Mn concentration of not less than 1.5 wt % and not more than 4.5 wt % in a crystal of the $Mn^{2+}$-activated γ-AlON phosphor.

In the above configuration, a wavelength conversion member is formed by combining the $Mn^{2+}$-activated γ-AlON phosphor, as a green phosphor, that emits green light in response to excitation by the blue light and the $Mn^{4+}$-activated phosphor, as a red phosphor, that emits red light in response to excitation by the blue light. The $Mn^{2+}$-activated γ-AlON phosphor has a Mn concentration of not less than 1.5 wt % and not more than 4.5 wt % in a crystal of the $Mn^{2+}$-activated γ-AlON phosphor.

In a case where the Mn concentration takes a value of less than 1.5 wt % or more than 4.5 wt % in the light emitting device in which the $Mn^{2+}$-activated γ-AlON phosphor and the $Mn^{4+}$-activated phosphor are excited by the blue light, color reproducibility of an image display apparatus deteriorates, for example, an NTSC color gamut coverage and an Adobe RGB color gamut coverage deteriorate. In other words, in a case where the Mn concentration is not less than 1.5 wt % and not more than 4.5 wt %, the NTSC color gamut coverage and the Adobe RGB color gamut coverage can be increased.

Therefore, the above light emitting device in accordance with Aspect 4 can advantageously provide an image display apparatus having a wide color reproduction range.

Moreover, in the above configuration, an excitation spectrum of the $Mn^{2+}$-activated γ-AlON phosphor has a larger half-width of a peak wavelength at or around 445 nm. Then, even when a peak wavelength of the blue light varies, excitation efficiency of the phosphor does not easily change. The above light emitting device in accordance with Aspect 4 can therefore advantageously provide an image display apparatus having less variation in color reproduction range (less color variation).

Furthermore, in the above configuration, Mn is contained at a concentration of not less than 1.5 wt % in the $Mn^{2+}$-activated γ-AlON phosphor. This can improve a blue light (excitation light) absorbance of the $Mn^{2+}$-activated γ-AlON phosphor. This makes it possible to improve a luminous efficiency of the light emitting device in accordance with Aspect 4.

The light emitting device in accordance with Aspect 5 is configured preferably such that, in Aspect 4, the green light emitted by the $Mn^{2+}$-activated γ-AlON phosphor has an emission-spectrum half width of not less than 35 nm and not more than 50 nm.

In the above configuration, in a case where the green light emitted by the $Mn^{2+}$-activated γ-AlON phosphor has a half width of less than 35 nm, the Mn concentration is less than 1.5 wt %. Meanwhile, in a case where the green light emitted by the $Mn^{2+}$-activated γ-AlON phosphor has a half width of more than 50 nm, the Mn concentration is more than 4.5 wt %. In such cases, an NTSC color gamut coverage and an Adobe RGB color gamut coverage deteriorate. In other words, in a case where the green light has an emission-spectrum half width of not less than 35 nm and not more than 50 nm, the NTSC color gamut coverage and the Adobe RGB color gamut coverage can be increased.

Therefore, the above light emitting device in accordance with Aspect 5 can provide an image display apparatus having a wide color reproduction range.

A light emitting device (10, 10a) in accordance with Aspect 6 of the present invention includes: a light emitting element (11) that emits blue light; a $Mn^{2+}$-activated γ-AlON phosphor (green phosphor 13) that emits green light in response to excitation by the blue light; and a $Mn^{4+}$-activated phosphor (red phosphor 12) that emits red light in response to excitation by the blue light, the green light emitted by the $Mn^{2+}$-activated γ-AlON phosphor having an emission-spectrum half width of not less than 35 nm and not more than 50 nm.

In the above configuration, a wavelength conversion member is formed by combining the $Mn^{2+}$-activated γ-AlON phosphor, as a green phosphor, that emits green light in response to excitation by the blue light and the $Mn^{4+}$-activated phosphor, as a red phosphor, that emits red light in response to excitation by the blue light. The green light emitted by the $Mn^{2+}$-activated γ-AlON phosphor has an emission-spectrum half width of not less than 35 nm and not more than 50 nm.

In a case where the green light has an emission-spectrum half width of less than 35 nm or more than 50 nm in the light emitting device in which the $Mn^{2+}$-activated γ-AlON phosphor and the $Mn^{4+}$-activated phosphor are excited by the blue light, color reproducibility of an image display apparatus deteriorates, for example, an NTSC color gamut coverage and an Adobe RGB color gamut coverage deteriorate. In other words, in a case where the green light has an emission-spectrum half width of not less than 35 nm and not more than 50 nm, the NTSC color gamut coverage and the Adobe RGB color gamut coverage can be increased.

Therefore, the above light emitting device in accordance with Aspect 6 can advantageously provide an image display apparatus having a wide color reproduction range.

Moreover, in the above configuration, the green light emitted by the $Mn^{2+}$-activated γ-AlON phosphor has an emission-spectrum half width in the above wavelength range. Accordingly, an excitation spectrum of the $Mn^{2+}$-activated γ-AlON phosphor has a larger half-width of a peak wavelength at or around 445 nm. Then, even when a peak wavelength of the blue light varies, excitation efficiency of the phosphor does not easily change. The above light emitting device in accordance with Aspect 6 can therefore advantageously provide an image display apparatus having less variation in color reproduction range (less color variation).

A light emitting device in accordance with Aspect 7 of the present invention is configured preferably such that, in any one of Aspects 1 to 6, the $Mn^{2+}$-activated γ-AlON phosphor contains Mg.

In the above configuration, the $Mn^{2+}$-activated γ-AlON phosphor contains Mg, so that the structure of a γ-AlON crystal is stabilized. Accordingly, Mn can be easily taken into this phosphor. This can make it easy to increase the Mn concentration in the $Mn^{2+}$-activated γ-AlON phosphor. As a result, the light emitting device in accordance with Aspect 7 can have an improved luminous efficiency.

A light emitting device in accordance with Aspect 8 of the present invention is configured preferably such that, in any one of Aspects 1 to 7, the $Mn^{4+}$-activated phosphor is a $Mn^{4+}$-activated fluorine complex phosphor.

In the above configuration, the red light emitted by the $Mn^{4+}$-activated fluorine complex phosphor has a small emission-spectrum half width and a high excitation efficiency with respect to the blue light. Therefore, the light emitting device in accordance with Aspect 8 can have an improved luminous efficiency. Further, the limit of the color reproduction range can be expanded on the red-range side. This makes it possible to provide a light emitting device excellent in color reproducibility in a red range.

A light emitting device in accordance with Aspect 9 of the present invention is configured preferably such that, in Aspect 8, the $Mn^{4+}$-activated fluorine complex phosphor is $K_2(T_{1-h}Mn_h)F_6$ or $K_2(S_{1-h}Mn_h)F_6$; and h is not less than 0.001 and not more than 0.1.

In the above configuration, the $Mn^{4+}$-activated fluorine complex phosphor is $K_2(Ti_{1-h}Mn_h)F_6$ or $K_2(Si_{1-h}Mn_h)F_6$; and h is not less than 0.001 and not more than 0.1. Accordingly, the $Mn^{4+}$-activated fluorine complex phosphor has a high emission intensity and a crystal of the phosphor is highly stable. This makes it possible to improve a luminous efficiency and reliability of the light emitting device in accordance with Aspect 9.

A light emitting device in accordance with Aspect 10 of the present invention is configured preferably such that, in Aspect 8 or 9, the $Mn^{4+}$-activated fluorine complex phosphor is a $Mn^{4+}$-activated $K_2SiF_6$ phosphor.

In the above configuration, the $Mn^{4+}$-activated $K_2SiF_6$ phosphor has a high stability (water resistance). This makes it possible to improve reliability of the light emitting device in accordance with Aspect 10.

A light emitting device in accordance with Aspect 11 of the present invention is configured preferably such that, in any one of Aspects 1 to 10, the blue light has a peak wavelength of not less than 440 nm and not more than 460 nm.

The above configuration makes it possible to improve the excitation efficiency of the $Mn^{2+}$-activated γ-AlON phosphor and the excitation efficiency of the $Mn^{4+}$-activated phosphor. Further, the peak wavelength of the blue light is well-matched with the transmission spectrum of the blue color filter that transmits the blue light. This makes it possible to improve a luminous efficiency of the light emitting device. Further, the image display apparatus including the light emitting device can have an improved luminance (display brightness).

A light emitting device (10a) in accordance with Aspect 12 of the present invention is configured preferably such that, in any one of Aspects 1 to 11, the $Mn^{2+}$-activated γ-AlON phosphor and the $Mn^{4+}$-activated phosphor are dispersed in one dispersion medium (16); and the dispersion medium contains a scattering material (light scattering material 17) that scatters the blue light emitted by the light emitting element.

In the above configuration, the scattering material that scatters the blue light (excitation light) emitted by the light emitting element is contained in the dispersion medium in which the $Mn^{2+}$-activated γ-AlON phosphor and the $Mn^{4+}$-activated phosphor are dispersed. This allows the $Mn^{2+}$-activated γ-AlON phosphor and the $Mn^{4+}$-activated phosphor to be more efficiently irradiated with the blue light that has been scattered by the scattering material. This makes it possible to reduce the amount of the $Mn^{2+}$-activated γ-AlON phosphor and $Mn^{4+}$-activated phosphor to be used. Further, the light emitting device can have an improved luminous efficiency.

An image display apparatus (100, 200) in accordance with Aspect 13 of the present invention preferably includes the light emitting device in accordance with any one of Aspects 1 to 12.

The above configuration can advantageously provide an image display apparatus having a wide color reproduction range.

An image display apparatus (100) in accordance with Aspect 14 of the present invention can be configured to further include, in Aspect 13, a green color filter (126g) that transmits the green light, the green color filter having a transmittance of not less than 80% for light in a wavelength range of not less than 520 nm and not more than 540 nm.

In the above configuration, the green color filter has a transmittance of not less than 80% for light in a wavelength range of not less than 520 nm and not more than 540 nm. The light emitting device employs the $Mn^{2+}$-activated γ-AlON phosphor as a green phosphor. Accordingly, even in a case where the green color filter having such a high transmittance is used, the image display apparatus can have a wider color reproduction range. Further, the image display apparatus can have an improved luminance because the green filter having a high transmittance can be used.

An image display apparatus (200) in accordance with Aspect 15 of the present invention can be configured to further include, in Aspect 13, a green color filter (126g') that transmits the green light; and a blue color filter (126b') that transmits the blue light, the green color filter having a transmittance of not more than 10% for light in a wavelength range of not less than 600 nm and not more than 680 nm, and a transmission spectrum half-width of not more than 90 nm, and the blue color filter having a transmittance of not more than 10% for light in a wavelength range of not less than 520 nm and not more than 680 nm, and a transmission spectrum half-width of not more than 100 nm.

The above configuration can provide an image display apparatus having a wider color reproduction range.

The present invention is not limited to the embodiments, but can be altered by a skilled person in the art within the scope of the claims. An embodiment derived from a proper combination of technical means each disclosed in a different embodiment is also encompassed in the technical scope of the present invention. Further, it is possible to form a new technical feature by combining the technical means disclosed in the respective embodiments.

CROSS-REFERENCE TO RELATED APPLICATIONS

This Nonprovisional application claims priority under 35 U.S.C. § 119 on Patent Applications Nos. 2015-170275, 2015-170276, and 2015-170277 which are filed in Japan on Aug. 31, 2015 and Nos. 2016-089385, 2016-089386, and 2016-089387 which are filed in Japan on Apr. 27, 2016, the entire contents of which are hereby incorporated by reference.

REFERENCE SIGNS LIST 10, 10a light emitting device
11 light emitting element
12 red phosphor ($Mn^{4+}$-activated phosphor, $Mn^{4+}$-activated fluorine complex phosphor, and $Mn^{4+}$-activated $K_2SiF_6$ phosphor)
13 green phosphor ($Mn^{2+}$-activated γ-AlON phosphor)
16 dispersion medium
17 light scattering material (scattering material)
100, 200 image display apparatus
126b' blue color filter
126g, 126g' green color filter

The invention claimed is:

1. An image display apparatus including a light emitting device, the light emitting device comprising:
   a light emitting element that emits blue light;
   a $Mn^{2+}$-activated γ-AlON phosphor that emits green light in response to excitation by the blue light; and
   a $Mn^{4+}$-activated phosphor that emits red light in response to excitation by the blue light, wherein
   the green light emitted by the $Mn^{2+}$-activated γ-AlON phosphor has an emission-spectrum peak wavelength of not less than 522 nm and not more than 524 nm,
   the green light emitted by the $Mn^{2+}$-activated γ-AlON phosphor has an emission-spectrum half width of not less than 38 nm and not more than 42 nm,
   the $Mn^{2+}$-activated γ-AlON phosphor has a Mn concentration of not less than 2.4 wt % and not more than 3.02 wt % in a crystal of the $Mn^{2+}$-activated γ-AlON phosphor,
   the $Mn^{2+}$-activated γ-AlON phosphor and the $Mn^{4+}$-activated phosphor are dispersed in one dispersion medium,
   the dispersion medium includes a scattering material that scatters the blue light emitted by the light emitting element, and
   a coverage is not less than 98%, the coverage being a ratio of an area covered within a color gamut of the image display apparatus with respect to an area of an Adobe RGB color gamut.

2. The image display apparatus as set forth in claim 1, wherein the $Mn^{2+}$-activated γ-AlON phosphor contains Mg.

3. The image display apparatus as set forth in claim 1, wherein the $Mn^{4+}$-activated phosphor is a $Mn^{4+}$-activated fluorine complex phosphor.

4. The image display apparatus as set forth in claim 3, wherein:
   the $Mn^{4+}$-activated fluorine complex phosphor is $K_2(Ti_{1-h}Mn_h)F_6$ or $K_2(Si_{1-h}Mn_h)F_6$; and
   h is not less than 0.001 and not more than 0.1.

5. The image display apparatus as set forth in claim 3, wherein the $Mn^{4+}$-activated fluorine complex phosphor is a $Mn^{4+}$-activated $K_2SiF_6$ phosphor.

6. The image display apparatus as set forth in claim 1, wherein the blue light has a peak wavelength of not less than 440 nm and not more than 460 nm.

7. The image display apparatus as set forth in claim 1, further comprising:
a green color filter that transmits the green light, wherein
the green color filter has a transmittance of not less than 80% for light in a wavelength range of not less than 520 nm and not more than 540 nm.

8. The image display apparatus as set forth in claim 1, further comprising:
a green color filter that transmits the green light; and
a blue color filter that transmits the blue light, wherein
the green color filter has a transmittance of not more than 10% for light in a wavelength range of not less than 600 nm and not more than 680 nm, and a transmission spectrum half-width of not more than 90 nm, and
the blue color filter has a transmittance of not more than 10% for light in a wavelength range of not less than 520 nm and not more than 680 nm, and a transmission spectrum half-width of not more than 100 nm.

* * * * *